United States Patent
Nagura

(10) Patent No.: US 10,209,102 B2
(45) Date of Patent: Feb. 19, 2019

(54) POSITION DETECTION APPARATUS, MACHINE TOOL APPARATUS, AND EXPOSURE APPARATUS

(71) Applicant: CANON KABUSHIKI KAISHA, Tokyo (JP)

(72) Inventor: Chihiro Nagura, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 183 days.

(21) Appl. No.: 15/453,232

(22) Filed: Mar. 8, 2017

(65) Prior Publication Data

US 2017/0261351 A1 Sep. 14, 2017

(30) Foreign Application Priority Data

Mar. 14, 2016 (JP) .................. 2016-049750

(51) Int. Cl.
| | |
|---|---|
| G01D 5/38 | (2006.01) |
| G01D 5/347 | (2006.01) |
| G03F 7/20 | (2006.01) |
| G05B 19/402 | (2006.01) |
| G05B 19/418 | (2006.01) |

(52) U.S. Cl.
CPC ..... G01D 5/34707 (2013.01); G01D 5/34746 (2013.01); G01D 5/38 (2013.01); G03F 7/70616 (2013.01); G03F 7/70775 (2013.01); G05B 19/402 (2013.01); G05B 19/4182 (2013.01)

(58) Field of Classification Search
CPC .. G01D 5/34707; G01D 5/34746; G01D 5/38; G03F 7/70775

USPC .......................................................... 356/499
See application file for complete search history.

(56) References Cited

U.S. PATENT DOCUMENTS

| 6,664,538 B1* | 12/2003 | Farnsworth | G01D 5/38 |
| | | | 250/231.14 |
| 7,710,578 B2* | 5/2010 | Sandig | G01D 5/38 |
| | | | 356/499 |

(Continued)

FOREIGN PATENT DOCUMENTS

| EP | 2963391 A1 | 1/2016 |
| JP | H08-297035 A | 11/1996 |

(Continued)

*Primary Examiner* — Michael A Lyons
(74) *Attorney, Agent, or Firm* — Rossi, Kimms & McDowell LLP

(57) ABSTRACT

A position detection apparatus (100) includes a scale (20) including a reference position grating (22), a detector (10), a detection grating (19), and a signal processor (10), the signal processor acquires a relative reference position between the scale and the detector by using a light intensity distribution of a divergent light beam obtained via the reference position grating and the detection grating, the detection grating has a first spatial frequency that is offset by a predetermined frequency offset amount with respect to a local spatial frequency of an interference image from the reference position grating, the detection grating is provided in an optical path between the scale and a light receiver of the detector, and the light receiver detects a component of a second spatial frequency that is lower than the first spatial frequency in the light intensity distribution transmitting through the detection grating.

12 Claims, 17 Drawing Sheets

(56) References Cited

U.S. PATENT DOCUMENTS

| | | | | |
|---|---|---|---|---|
| 7,872,762 B2* | 1/2011 | Hermann | ............... | G01D 5/38 |
| | | | | 250/237 G |
| 8,817,272 B2 | 8/2014 | Hermann | | |
| 9,303,979 B2* | 4/2016 | Holzapfel | ............... | G01D 5/38 |
| 2012/0176629 A1* | 7/2012 | Allen | ............... | G01D 5/34746 |
| | | | | 356/616 |
| 2015/0362344 A1* | 12/2015 | Kimura | ............... | G01D 5/2448 |
| | | | | 250/231.1 |
| 2016/0209247 A1* | 7/2016 | Nagura | ............. | G01D 5/34746 |

FOREIGN PATENT DOCUMENTS

| | | |
|---|---|---|
| JP | 2012500981 A | 1/2012 |
| JP | 2016008965 A | 1/2016 |

\* cited by examiner

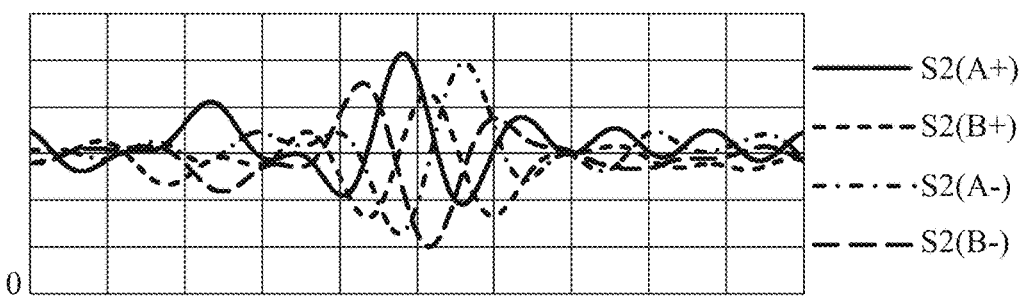
FIG. 6A
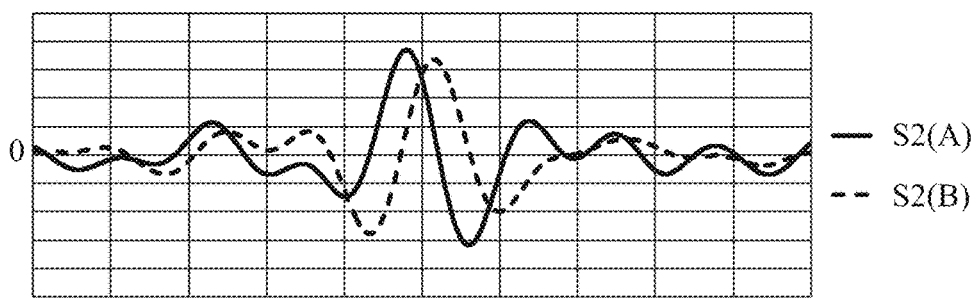
FIG. 6B
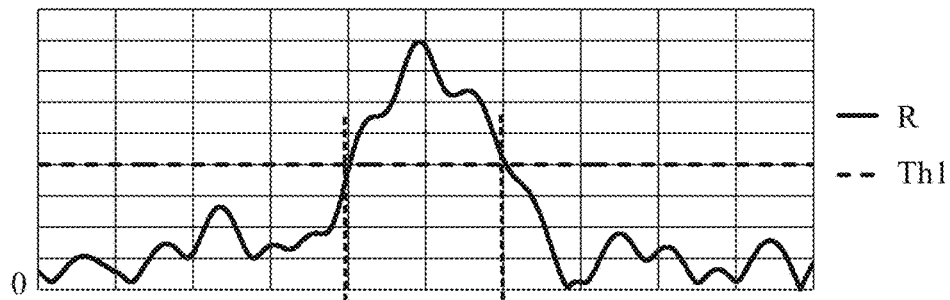
FIG. 6C
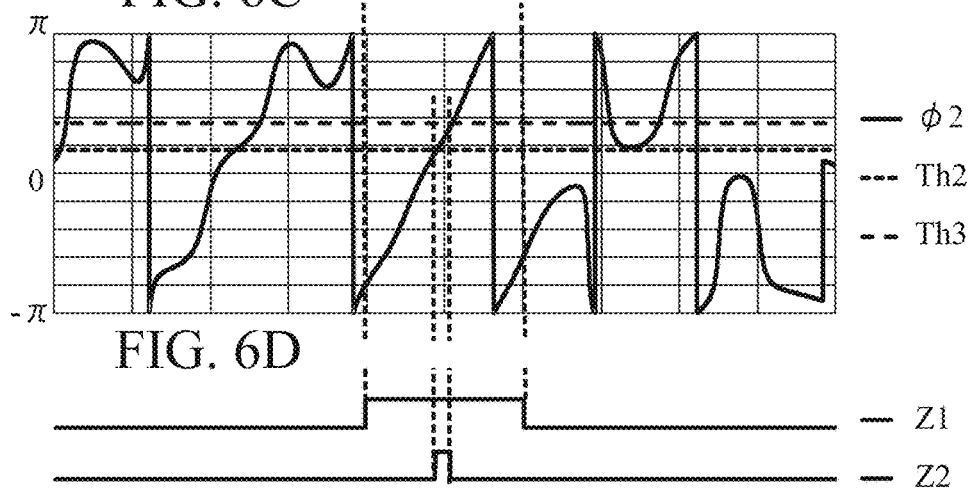
FIG. 6D
FIG. 6E

POSITION DETECTION APPARATUS, MACHINE TOOL APPARATUS, AND EXPOSURE APPARATUS

BACKGROUND OF THE INVENTION

Field of the Invention

The present invention relates to a position detection apparatus that detects a position of an object.

Description of the Related Art

Previously, an encoder is used as a position detection apparatus provided in a machine tool, an FA equipment, or the like. In an incremental encoder, a reference point is detected by using a reference position mark provided at a specific position on a scale, and a position within a stroke is detected based on a moving amount relative to the reference point.

Japanese Translation of PCT International Application Publication No. 2012-500981 discloses a method of detecting a reference point on a scale. In the method disclosed in Japanese Translation of PCT International Application Publication No. 2012-500981, a solitary wave (i.e., signal having an amplitude only at an origin) which is generated at a reference position on the scale is used, and a reference position pulse is generated based on a result obtained by comparing this solitary wave with a threshold value. Furthermore, reversed-phase pulses where positive and negative signs are reversed to each other are generated to perform a differential calculation, and thus a pulse position of a reference point signal does not easily vary even when variation of an amount of light emitted from the light source.

However, in a conventional typical reference point detection method, a fine light receiving element array is needed to obtain a highly-accurate reference position signal, and accordingly manufacturing a sensor requires cost. To solve this problem, a configuration where a light receiving element with a large area is disposed behind a fine optical grating is known. In this configuration, however, it is necessary to use different grating areas to generate the reversed-phase pulses where the positive and negative signs are reversed to each other, and thus an apparatus increases in size.

SUMMARY OF THE INVENTION

The present invention provides small-size position detection apparatus, machine tool apparatus, and exposure apparatus that are capable of detecting a reference position with high accuracy at low cost.

A position detection apparatus as one aspect of the present invention includes a scale including a reference position grating configured to change a pattern period along a first direction, a detector including a light source configured to emit a divergent light beam, a detection grating configured to change a pattern period in the first direction, and a light receiver including a plurality of light receiving elements arrayed along the first direction, and a signal processor configured to process a signal output from the detector, the scale and the detector are relatively movable in the first direction, the signal processor acquires a relative reference position between the scale and the detector by using a light intensity distribution of the divergent light beam obtained via the reference position grating and the detection grating, the detection grating has a first spatial frequency that is offset by a predetermined frequency offset amount with respect to a local spatial frequency of an interference image from the reference position grating, the detection grating is provided in an optical path between the scale and the light receiver, and the light receiver detects a component of a second spatial frequency that is lower than the first spatial frequency in the light intensity distribution transmitting through the detection grating.

A machine tool apparatus as another aspect of the present invention includes a machine tool including at least one of a robot arm and a conveyer configured to convey an object to be assembled and the position detection apparatus configured to detect at least one of a position and an attitude of the machine tool.

An exposure apparatus as another aspect of the present invention includes a stage configured to mount a semiconductor wafer to be movable in a two-dimensional direction and the position detection apparatus configured to detect a position of the stage.

Further features of the present invention will become apparent from the following description of exemplary embodiments with reference to the attached drawings.

BRIEF DESCRIPTION OF THE DRAWINGS

FIGS. 6A to 6E are signal waveform diagrams in the vicinity of a reference position mark in the first embodiment.

DESCRIPTION OF THE EMBODIMENTS

Exemplary embodiments of the present invention will be described below with reference to the accompanied drawings.

First Embodiment

Figure 1:
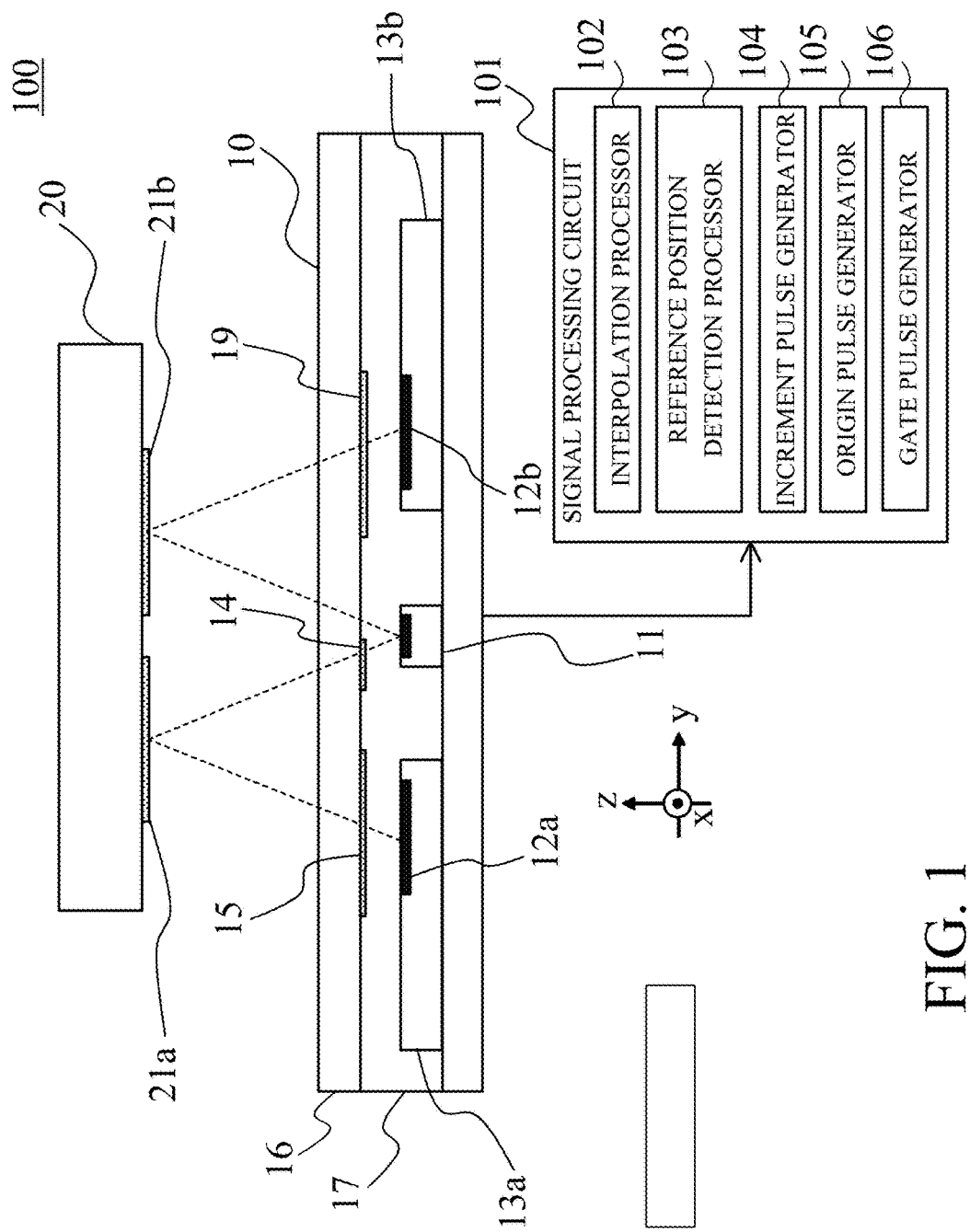
FIG. 1 is a configuration diagram of a position detection apparatus in a first embodiment.

First, referring to FIG. 1, an optical position detection apparatus (optical encoder) in a first embodiment of the present invention will be described. FIG. 1 is a configuration diagram of a position detection apparatus 100 in this embodiment. The position detection apparatus 100 includes a scale that is attached to a movable portion (object), a sensor unit 10 (detection unit) as a detector that is attached to a fixed portion, and a signal processing circuit 101 (signal processor). In this embodiment, the relation between the fixed portion and the movable portion may be reversed to each other, and thus the sensor unit 10 can be attached to the movable portion and the scale 20 can be attached to the fixed portion. In other words, the sensor unit 10 and the scale 20 only have to be relatively movable in a first direction (X direction).

The signal processing circuit 101 includes an interpolation processor 102, a reference position detection processor 103, an increment pulse generator 104, an origin pulse generator 105, and a gate pulse generator 106, and it processes a signal output from the sensor unit 10. In this embodiment, the interpolation processor 102 and the increment pulse generator 104 constitute a pulse generator (pulse generating unit), and the reference position detection processor 103, the origin pulse generator 105, and the gate pulse generator 106 constitute a reference position generator (reference position generating unit). The interpolation processor 102 performs interpolation processing of an encoder signal (position detection signal) that is obtained from the sensor unit 10. The reference position detection processor 103 performs detection processing of a reference position on the scale 20. The increment pulse generator 104 generates an increment pulse. The gate pulse generator 106, as described below, limits a range of an output of an origin signal Z2. The origin pulse generator 105 generates an origin pulse that is synchronous with an edge of the interpolation pulse. The signal processor 101, as described below, acquires a relative reference position between the scale 20 and the sensor unit 10 by using a light intensity distribution (energy distribution) that is obtained via a reference position grating (reference position mark 22) and a detection grating (reference position detection grating 19). The light intensity distribution is a light intensity distribution of a divergent light beam passing through the reference position grating and the detection grating from the light source.

The sensor unit 10 is a light receiving and emitting integrated sensor unit where a light source 11 including for example an LED (light emitting device), a light receiving IC 13a including a light receiving element array 12a, and a light receiving IC 13b including a light receiving element array 12b which are mounted in a package. The scale 20 includes, as scale tracks 21a and 21b, stepped parts fabricated and patterned on a quartz substrate. The stepped parts are formed by etching at a depth around one-fourth of a wavelength of the light source, and an aluminum film and a dielectric film are laminated as reflection films on its surface.

In an optical path from the light source 11 in the sensor unit 10 toward the scale track 21a, a light source grating 14 is provided as a transmission type diffraction grating that includes transmission parts and light shielding parts that are alternately arrayed in the position detection direction (X direction). In an optical path from the scale track 21a toward the light receiving element array 12a, an increment detection grating 15 is provided. The increment detection grating 15 is a transmission type diffraction grating that includes transmission parts and light shielding parts that are alternately arrayed in the position detection direction. In an optical path from the scale track 21b toward the light receiving element array 12b, a reference position detection grating 19 (detection grating) that includes transmission parts and light shielding parts that are alternately arrayed in the position detection direction (X direction) with unequal intervals is provided. In other words, the sensor unit 10 includes the detection grating whose pattern period changes along the first direction (X direction).

Each of the light source grating 14, the increment detection grating 15, and the reference position detection grating 19 is provided by forming a chromium film as transmission parts on a surface of a cover glass 16. The cover glass 16 is stuck to a light translucent resin 17 that seals the light source 11 and the light receiving ICs 13a and 13b, and it is optically integrated with the light source 11 and the light receiving ICs 13a and 13b.

Figure 2:
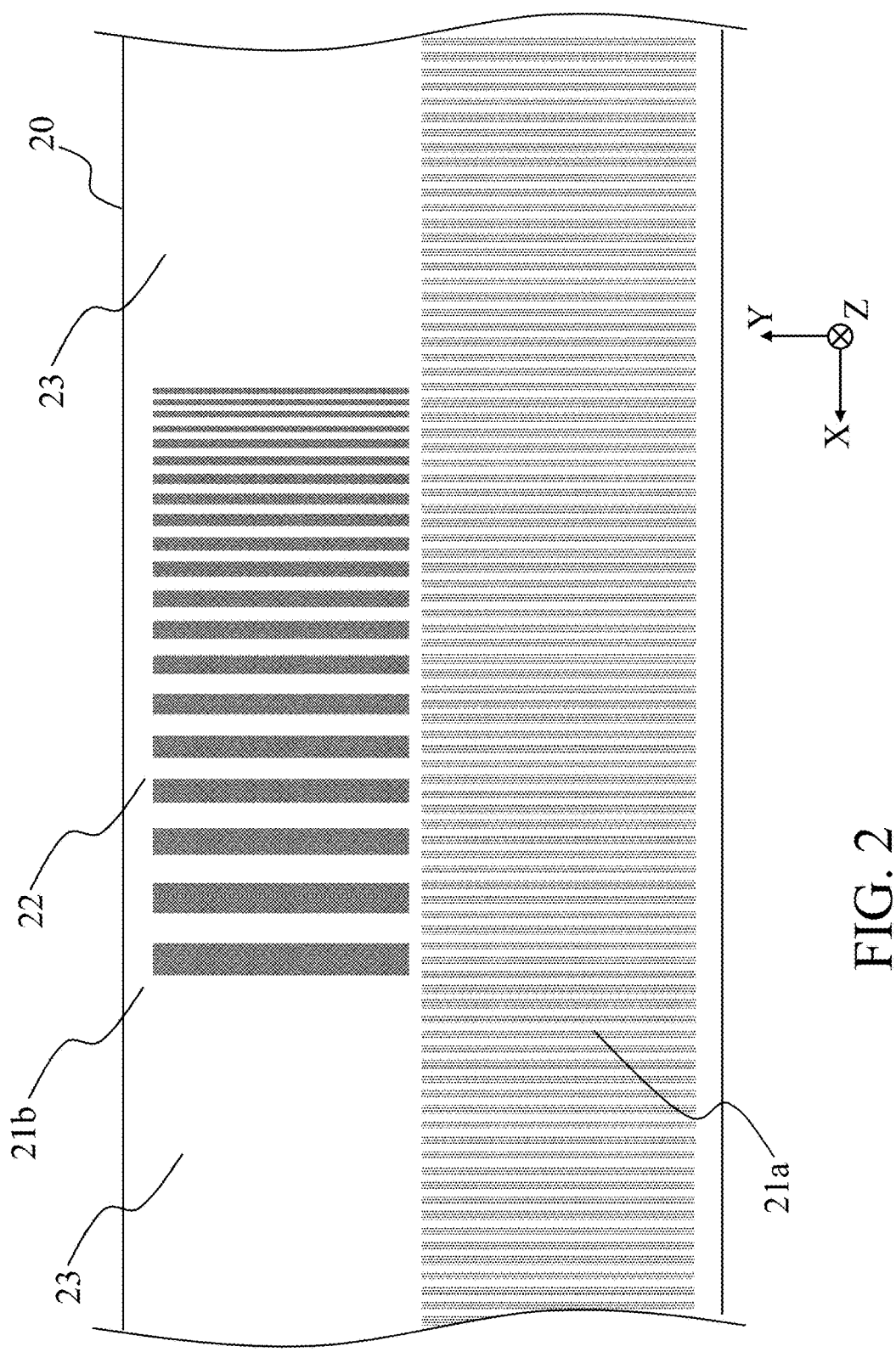
FIG. 2 is a plan view of a scale in each embodiment.

Next, referring to FIG. 2, the configuration of the scale tracks 21a and 21b in the scale 20 will be described. FIG. 2 is an enlarged plan view of a part of the scale 20 (scale tracks 21a and 21b). In FIG. 2, a gray area illustrates concave portions of a stepped pattern. The scale track 21a includes a pattern array where stepped patterns with a width of 2 μm are arranged per a period, i.e., pitch (=4 μm), in a moving direction (X direction). On the scale track 21b that is arranged in parallel to the scale track 21a, a reference position mark 22 (reference position grating) where concave portions arranged in the moving direction (X direction) with unequal intervals is formed at a specific position (reference position) on the scale 20. In other words, the scale 20 includes the reference position grating where the pattern period changes along the first direction (X direction). In an area other than the reference position mark 22 of the scale track 21b, a reflection portion 23 is formed by using a uniform reflection film.

Figure 3:
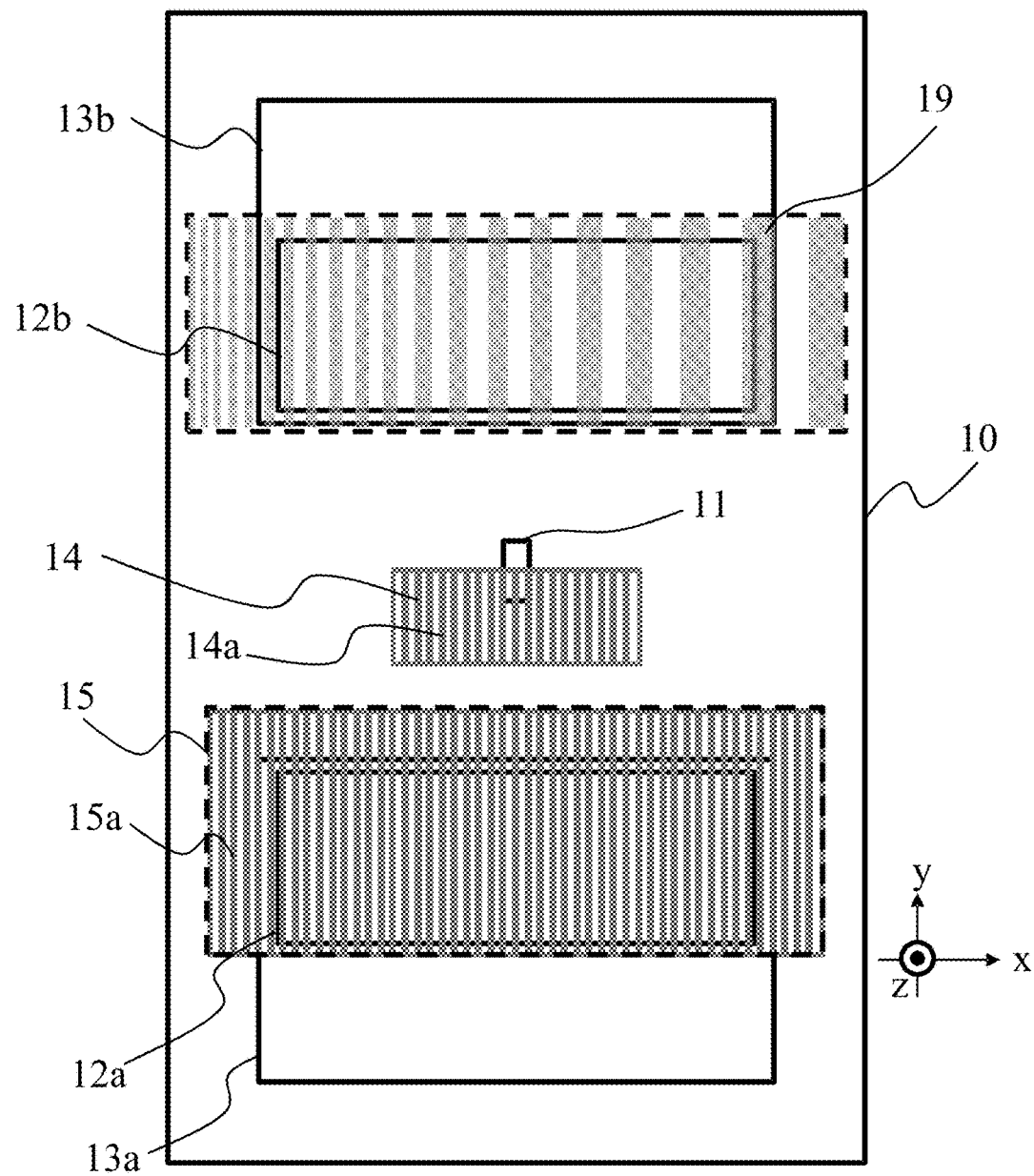
FIG. 3 is a plan view of a sensor unit in the first embodiment.

Next, referring to FIG. 3, the configuration of the sensor unit 10 will be described. FIG. 3 is a plan view of the sensor unit 10, and it illustrates a view of the sensor unit 10 from the scale 20. A pitch (pattern pitch) of a grating pattern 14a of the light source grating 14 is 4 μm. The increment detection grating 15 is provided with a grating pattern 15a having a predetermined pitch (=4.069952 μm) in the position detection direction (X direction).

Figure 4:
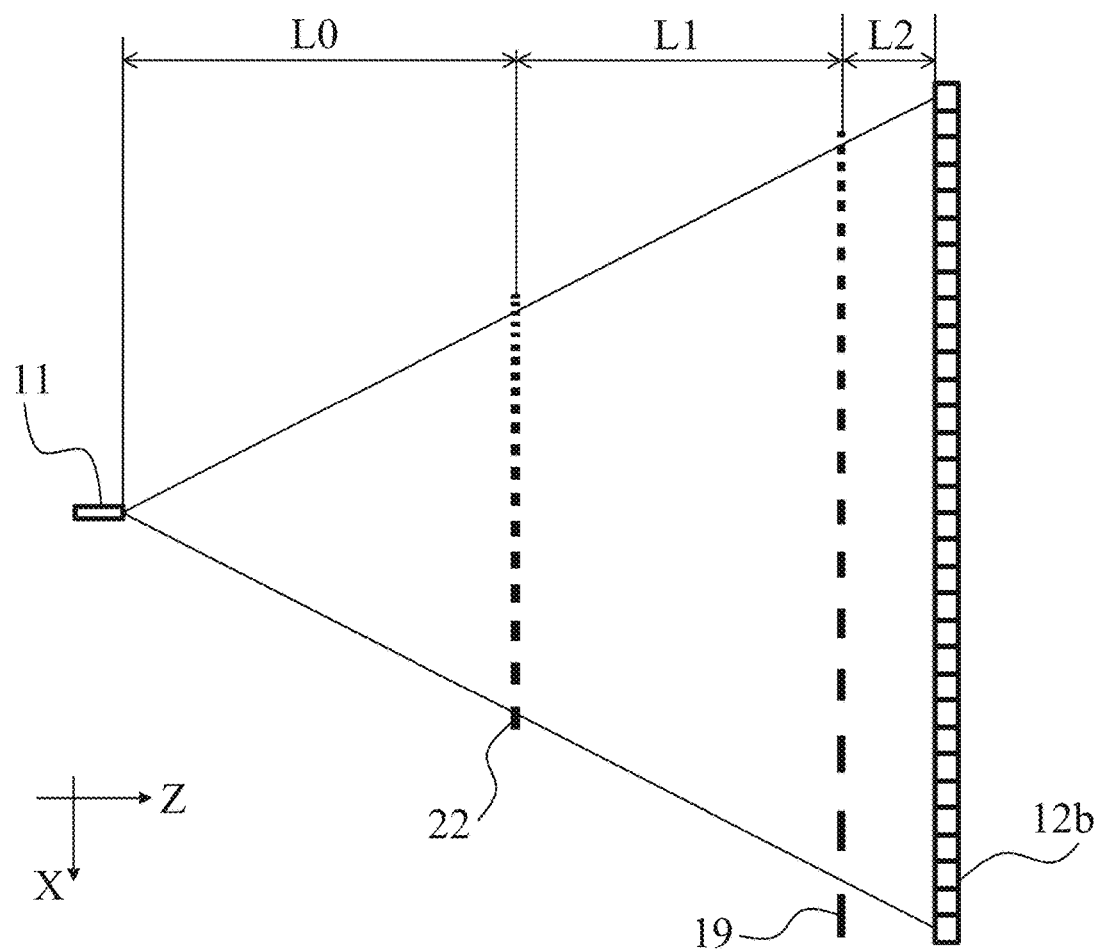
FIG. 4 is a development view of an optical path in the first embodiment.

Next, referring to FIG. 4, an optical path in the position detection apparatus 100 will be described. FIG. 4 is a development view of the optical path in the position detection apparatus 100, and it illustrates the optical path developed to treat reflection as transmission. A distance L0 as an effective optical path length from the light source 11 to the reference position mark 22 is set within a range of 1 mm±0.3 mm. The effective optical path length is a value (or its approximation value) obtained by dividing a physical length by a refractive index. A distance L1 as an effective optical path length from the reference position mark 22 to the reference position detection grating 19 is set to L1=L0−0.2 mm. A distance L2 as an effective optical path length from the reference position detection grating 19 to the light receiving element array 12b is 0.2 mm.

In the reference position mark 22, a stepped shape is formed with a distribution of a grating period d(x) that is represented by expression (1) below.

$$d(x) = d_0 \cdot (\text{sign}(\cos(2\pi \cdot (f_0 x + \frac{\alpha}{2} x^2))) + 1)/2 \quad (1)$$

In expression (1), symbol sign[a] is a function of returning a sign of "a". Symbol $d_0$ is a depth of the step, and it is around one-fourth of a center wavelength of the light source 11. Symbol $f_0$ is a center value of the spatial frequency of the reference position mark 22, and it is 14.29[mm$^{-1}$] in this embodiment. Symbol α is represented by expression (2) below.

$$\alpha = m \cdot f_0 \cdot \frac{2}{W_{pd}} \cdot \frac{(L_0 + L_1 + L_2)}{L_0} \quad (2)$$

In expression (2), symbol m is a degree of modulation of a spatial frequency component included in a detection range, and m is equal to 0.5 (m=0.5) in this embodiment. If the distance L0, L1, or L2 varies depending on individual differences or attachment errors, a designed center value may be used. Symbol $W_{pd}$ is a total width of the light receiving element array 12b described below in the position detection direction (X direction).

As described above, a spatial frequency $f_{org}(x)$ of the reference position mark 22 is represented by expression (3) below.

$$f_{org}(x) = f_0 + \alpha x \quad (3)$$

A light beam reflected by the reference position mark 22 forms a diffracted interference image on the reference position detection grating 19. A spatial frequency $f_{image}(x)$ of the diffracted interference image formed on the reference position detection grating 19 (i.e., local spatial frequency of the interference image from the reference position mark 22) is represented by expression (4) below.

$$f_{image}(x) = \left(f_0 + \alpha x \cdot \frac{L_0 + L_1}{L_0}\right) \cdot \frac{2L_0}{L_0 + L_1} \quad (4)$$

On the other hand, the reference position detection grating 19 includes transmission parts and light shielding parts, and a spatial frequency $f_{index}(X)$ (first frequency) of the reference position detection grating 19 is represented by expression (5) below.

$$f_{index}(x) = f_1 + f_{shift} + \beta x \quad (5)$$

In expression (5), symbols $f_1$, $f_{shift}$, and β are represented by expressions (6), (7), and (8), respectively. In expression (7), symbol $f_{pd}$ is defined as represented by expression (9) below.

$$f_1 = k \cdot f_0 \cdot \frac{L0}{(L_0 + L_1)} \quad (6)$$

$$f_{shift} = f_{pd} \cdot \frac{(L_0 + L_1 + L_2)}{(L_0 + L_1)} \quad (7)$$

$$\beta = m \cdot f_1 \cdot \frac{2}{W_{pd}} \cdot \frac{(L_0 + L_1 + L_2)}{(L_0 + L_1)} \quad (8)$$

$$f_{pd} = \frac{1}{P_{pd}} \quad (9)$$

In expression (6), symbol k denotes an order of the interference image. When the interference image of ±1st order diffracted lights are used, k=2 is satisfied. In this embodiment, the reference position mark 22 includes steps around λ/4 (i.e., optical path length difference is λ/2), and in order to improve the efficiency of the ±1st order lights, the reference position detection grating 19 is set to satisfy k=2. When interference image of 0th order light and ±1st order lights is used, for example, the reference position mark 22 is an amplitude grating that is formed by a reflection part and a non-reflection part, k=1 is satisfied. In expression (9), as described below, symbol $P_{pd}$ is a period (cyclic period) of the light receiving element array 12b in the position detection direction (X direction).

When a relative position between the scale 20 and the sensor unit 10 is at the reference position, a difference between the spatial frequency $f_{index}(x)$ of the reference position detection grating 19 and the spatial frequency $f_{image}(x)$ of the diffracted interference image that is formed on the reference position detection grating 19 is represented by expression (10) below.

$$f_{index}(x) - f_{image}(x) = f_{shift} \quad (10)$$

As represented by expression (10), the intensity distribution of the transmitted light is a moire fringe that has a moire frequency $f_{shift}$ (i.e., frequency offset amount (predetermined frequency offset amount or frequency shift amount) between the spatial frequencies $f_{index}(X)$ and $f_{image}(x)$). This moire fringe is enlarged by propagation from the reference position detection grating 19 to the surface of the light receiving element array 12b, and it is the intensity distribution that coincides with $f_{pd}$ on the light receiving element array 12b.

As described above, the reference position detection grating 19 has a first spatial frequency $f_{index}(x)$ that is obtained by offsetting (shifting) the local spatial frequency $f_{image}(x)$ of the interference image from the reference position mark 22 by the predetermined frequency offset amount (moire frequency $f_{shift}$). Preferably, the predetermined frequency offset amount is constant at the reference position detection grating 19. Preferably, the light receiving element array 12b detects a component of a second spatial frequency that is lower than the spatial frequency $f_{index}$ (x) (first spatial frequency) of the light intensity distribution that transmits through the reference position detection grating 19. Preferably, the light receiving element array 12b includes a plurality of light receiving element groups that are cyclically arrayed to detect a plurality of phase components of the second spatial frequency.

Figure 5:
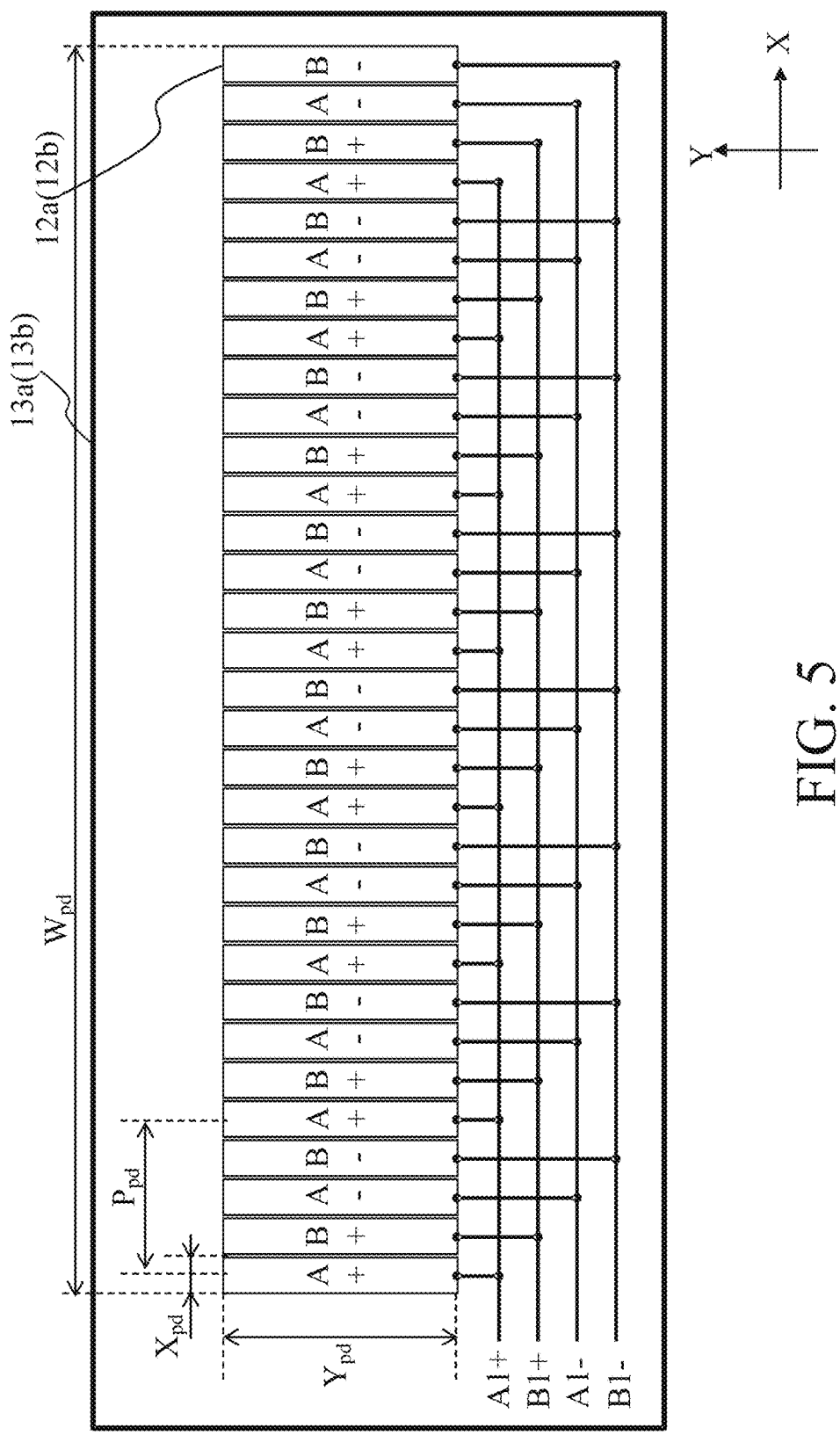
FIG. 5 is a plan view of a light receiving element array in each embodiment.

Subsequently, referring to FIG. 5, the arrangement of the light receiving element array 12a (light receiver) of the light receiving IC 13a will be described. FIG. 5 is a plan view of the light receiving element array 12a, and it illustrates the arrangement of a light receiving surface of the light receiving element array 12a. In the light receiving element array 12a, a plurality of (32) light receiving elements are arrayed along the position detection direction (X direction) in line. With respect to a single light receiving element, a width $X_{pd}$ in the position detection direction (X direction) is 64 μm and a width $Y_{pd}$ in a direction (Y direction) perpendicular to the position detection direction is 450 µm. A total width $W_{pd}$ of the light receiving element array 12a in the position detection direction (X direction) is 2048 µm.

The 32 light receiving elements are cyclically allocated in order of A+ phase, B+ phase, A− phase, and B− phase, and eight light receiving elements allocated as each phase of the four phases constitute a light receiving element group. The period $P_{pd}$ (cyclic period) is 256 µm that corresponds to a width of four light receiving elements, and it corresponds to a detection period of a light intensity distribution on the light receiving element surface. The eight light receiving elements constituting each light receiving element group are electrically connected to each other, and outputs (currents) of the respective light receiving elements are added to each other to be input to an I-V conversion amplifier (not illustrated) provided for each phase at the latter stage. Four I-V conversion amplifiers output four-phase signals S1(A+), S1(B+), S1(A−), and S1(B−), respectively.

The signals S1(A+), S1(B+), S1(A−), and S1(B−) are voltage signals (sine wave signals) which change in a sine wave shape according to a movement of the scale 20. The output signals of the four I-V conversion amplifiers provided for the four phases correspond to 0, 90, 180, and 270 degrees of a signal phase, respectively. The signal processing circuit 101 performs calculation processing represented by expressions (11) and (12) below on the four-phase signals S1(A+), S1(B+), S1(A−), and S1(B−) to be converted into two-phase sine wave signals S1(A) and S1(B) (position information) in which direct-current (DC) components have been removed from the four-phase signals.

$$S1(A)=S1(A+)-S1(A-) \tag{11}$$

$$S1(B)=S1(B+)-S1(B-) \tag{12}$$

The signal processing circuit 101 performs calculation represented by expression (13) below to acquire a phase signal Φ1 as a basis of a position signal.

$$\Phi 1 = \text{ATAN } 2[S1(A), S1(B)] \tag{13}$$

In expression (13), symbol ATAN 2[Y,X] is an arctangent function that determines a quadrant to convert the phase into a phase of 0 to 2π.

Subsequently, interpolation processing which is performed by the interpolation processor 102 and the increment pulse generator 104 (pulse generator) will be described. When the number of division of the interpolation by the interpolation processor 102 is n, increment pulses A and B are processed as outputs represented by the following expressions (14) and (15), respectively.

$$A=-\text{INT}[\text{MOD }[n \cdot \Phi 1/\pi, 2]-1] \cdot Vh \tag{14}$$

$$B=-\text{INT}[\text{MOD }[n \cdot \Phi 1/\pi - 0.5, 2]-1] \cdot Vh \tag{15}$$

In expressions (14) and (15), symbol INT[x] is a function which returns an integer obtained by rounding down decimal places of x. Symbol MOD [x,y] is a function which returns a remainder of x when divided by y. Symbol Vh is a voltage of the high level of a pulse. In such interpolation processing, the increment pulses A and B whose phases are shifted by 90 degrees from each other are obtained as a pulse train with n periods within one period of a sine wave. The increment pulses A and B obtained by the interpolation processor 102 are output from the increment pulse generator 104.

The arrangement of the light receiving element array 12b (light receiver) of the light receiving IC 13b is the same as that of the light receiving element array 12a illustrated in FIG. 5. Output (currents) of the respective four light receiving elements are added to each other to be input to an I-V conversion amplifier (not illustrated) provided for each phase at the latter stage. Four I-V conversion amplifiers output four-phase signals S2(A+), S2(B+), S2(A−), and S2(B−), respectively. The reference position detection processor 103 performs calculation represented by expressions (16) and (17) below on the four-phase signals S2(A+), S2(B+), S2(A−), and S2(B−) to generate two-phase signals S2(A) and S2(B) (two-phase solitary wave signals) in which direct-current (DC) components have been removed.

$$S2(A)=S2(A+)-S2(A-)-\Delta 1 \tag{16}$$

$$S2(B)=S2(B+)-S2(B-)-\Delta 2 \tag{17}$$

In expressions (16) and (17), symbols Δ1 and Δ2 are predetermined offset amounts, which may be zero. Each of the offset amounts Δ1 and Δ2 may be determined based on a design value. Alternatively, they may be acquired by scanning and learning for initialization or may be updated during an actual operation. It is preferred that the offset amounts Δ1 and Δ2 are determined so that for example each of the signals S2(A) and S2(B) is a value of zero or near zero in an area of the reflection part 23.

According to the arrangement of the light receiving element array described above, the balance of the light amount that is incident on each light receiving element group is maintained, and the direct-current components of the four-phase signals approximately coincide with each other. As a result, offset variation of the two-phase signals S2(A) and S2(B) is extremely small.

The reference position detection processor 103 performs calculation represented by expression (18) below to acquire a phase signal Φ2.

$$\Phi 2 = \text{ATAN } 2[S2(A), S2(B)] \tag{18}$$

In expression (18), symbol ATAN 2[Y,X] is an arctangent function that determines a quadrant to convert the phase into a phase of 0 to 2π.

According to the arrangement of the light receiving element array described above, the influence on the phase signal Φ2 due to foreign substances on the scale or pattern defects is reduced.

The reference position detection processor 103 acquires a distance signal R according to calculation that is represented by expression (19) below.

$$R=\sqrt{S2(A)^2+S2(B)^2} \tag{19}$$

The gate pulse generator 106 determines whether both conditions represented by expressions (20) and (21) are satisfied.

$$R>Th1 \tag{20}$$

$$Th2<\Phi 2<Th3 \tag{21}$$

When both of the conditions are satisfied, the gate pulse generator 106 outputs a signal (gate pulse Z1) at H level (Vh). On the other hand, when at least one of the conditions is not satisfied, the gate pulse generator 106 outputs a signal at L level (zero), i.e. it does not output the gate pulse Z1.

In expressions (20) and (21), symbols Th1, Th2, and Th3 denote previously stored threshold values (predetermined threshold values). Each threshold value can be determined based on a design value, or alternatively it may be determined based on learning by scanning for initialization. Each threshold value can be updated during an actual operation. In this case, it is preferred that the threshold values Th2 and Th3 are set so that a width of the gate pulse Z1 at H level is around a period of each of the two-phase sine wave signals S1(A) and S1(B).

The origin pulse generator 105 determines whether or not expressions (22) and (23) below are satisfied.

$$0 + 2\pi \times m/(4n) < \Phi 2 < \pi/(2n) + 2\pi \times m/(4n) \quad (22)$$

$$Z1 > Vh/2 \quad (23)$$

When both of the conditions of expressions (22) and (23) are satisfied, the origin pulse generator 105 outputs a signal (origin signal Z2 as an origin pulse) at H level (Vh). On the other hand, when at least one of the conditions is not satisfied, the origin pulse generator 105 outputs a signal at low level (zero), i.e., it does not output the origin signal Z2 (origin pulse). In expression (16), symbol m is an integer from 0 to n−1. The integer m is adjusted in the initial operation so that a margin with respect to an edge position of the gate pulse Z1 is maximized. Alternatively, the margin may be ensured by the adjustment of the threshold values Th1, Th2, and Th3 while the integer m is fixed. In this embodiment, the origin signal Z2 (origin pulse) that is synchronous with specific adjacent edges of the increment pulses A and B can be generated.

As described above, the signal processing circuit 101 calculates the first phase signal and the second phase signal that have different phases by 90 degrees from each other based on the signals output from the sensor unit 10 (i.e., signals from the plurality of light receiving element groups). Then, the signal processing circuit 101 calculates, as a first evaluation value (distance signal R), a square root of a sum of a square of the first phase signal and a square of the second phase signal to compare the first evaluation value with a predetermined threshold value (threshold value Th1) to acquire the reference position. Preferably, the signal processing circuit 101 calculates, as a second evaluation value (phase signal Φ2), a phase angle obtained by an arctangent operation of the first phase signal and the second phase signal. Then, the signal processing circuit 101 acquires the reference position based on the first evaluation value and the second evaluation value.

Next, referring to FIGS. 6A to 6E, each signal waveform in the vicinity of the reference position mark 22 will be described. FIGS. 6A to 6E are signal waveform diagrams in the vicinity of the reference position mark 22. FIG. 6A illustrates waveforms of four-phase signals S2(A+), S2(B+), S2(A−), and S2(B−) in the vicinity of the reference position mark 22. FIG. 6B illustrates waveforms of two-phase signals S2(A) and S2(B) in the vicinity of the reference position mark 22. FIG. 6C illustrates waveforms of a distance signal R and a threshold value Th1 in the vicinity of the reference position mark 22. FIG. 6D illustrates waveforms of a phase signal Φ2 and threshold values Th2 and Th3 in the vicinity of the reference position mark 22. FIG. 6E illustrates waveforms of a gate pulse Z1 and an origin signal Z2 (origin pulse) in the vicinity of the reference position mark 22.

When the relative position between the scale 20 and the sensor unit 10 is at the reference position, the moire image has an intensity distribution which coincides with $f_{pd}$ on the light receiving element array 12b, and accordingly the distance signal R is locally maximized. In the vicinity of the reference position, the spatial frequency of the moire image changes while the phase of the moire image changes. Thus, the distance signal R is abruptly attenuated while the phase signal Φ2 changes with increasing a distance from the reference position. Whether the relative position is near the reference position can be determined based on a level of the distance signal R. Furthermore, the reference position can be detected with high accuracy based on the value of the phase signal Φ2.

When the spatial frequency of the reference position mark 22 changes linearly depending on a position of a moving direction (X direction), there is the following problem. When the relative position is shifted from the reference position by Δx that is represented by expression (24) below, the moire frequency comes close to $-f_{shift}$ and the distance signal R is locally maximized. As a result, error detection of the reference position may easily occur.

$$\Delta x = \frac{2 f_{shift}}{\beta} \cdot \frac{L_0}{(L_0 + L_1)} \quad (24)$$

Figure 7:
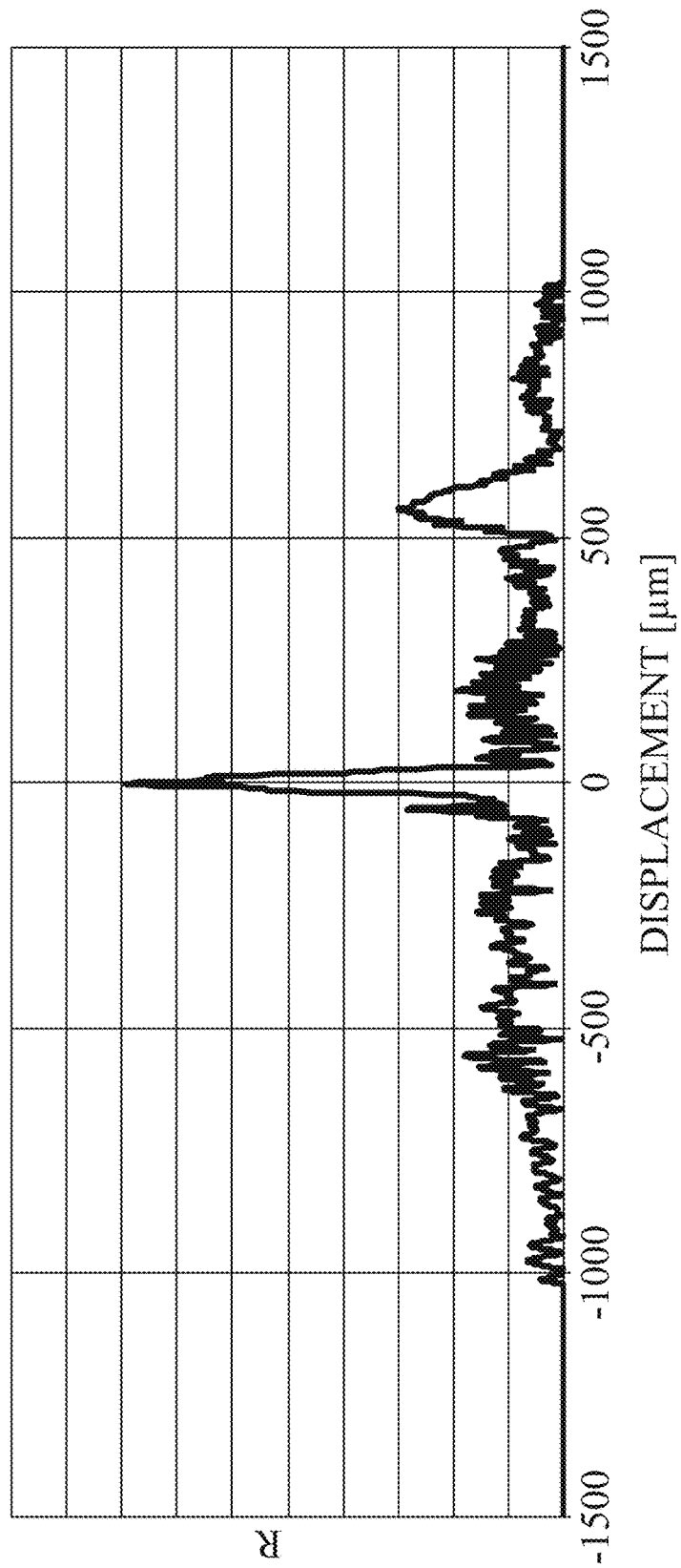
FIG. 7 is a diagram of illustrating a change of a distance signal R with respect to a movement of a scale in the first embodiment.

FIG. 7 is a graph of illustrating a change of the distance signal R with respect to a movement (relative movement) of the scale 20 over a wide range. In FIG. 7, a horizontal axis indicates a displacement (relative displacement between the scale 20 and the sensor unit 10), and a vertical axis indicates the distance signal R. According to the design values in this embodiment, Δx=598 μm is satisfied and a secondary peak occurs at a position of the scale 20 displaced by nearly +598 μm from the reference position.

Effective measures are to minimize the width of the reference position mark 22. In this embodiment, nearly a half of the total width $W_{pd}$ of the light receiving element array 12b is a necessary width of the reference position mark 22. Accordingly, the width of the reference position mark 22 is designed to nearly a half of the total width $W_{pd}$ of the light receiving element array 12b. Thus, at the position displaced by Δx, the influence can be reduced by designing the reflection part 23 so that a large area of the reflection part 23 is included in the detection range. The influence can be reduced also by providing an area where the spatial frequency of the reference position mark 22 increases depending on its position and an area where it decreases depending on its position. In particular, modulations are performed to be symmetric mirror images with respect to the right and left, and thus it is possible to suppress the influence of the secondary peak while a modulation width of the frequency is ensured.

While characteristics in the situation where an optical projection magnification does not change are described, it is preferred that an appropriate confirmation is adopted since the projection magnification varies depending on an interval of respective gratings or scale when a divergent light beam is used without using a lens element or the like. Hereinafter, the appropriate configuration will be described.

The spatial frequency of the reference position mark 22 is designed to monotonically increase or decrease (i.e., linearly change) depending on a position of the moving direction (X direction), and as a result the local maximum value of the distance signal R does not easily change even when the projection magnification (L0+L1+L2)/(L0+L1) is varied. While the period of the moire fringe is shifted due to the variation of the projection magnification, the frequency of the moire fringe projected on the light receiving element array 12b comes close to $f_{pd}$ almost simultaneously for a whole of the light receiving element array by the shift of the position of the scale 20. As a result, it is possible to generate a stable reference position signal over a wide gap range.

However, when the linearly-modulated reference position mark 22 is used, the change of the spatial frequency of the moire fringe due to the variation of the projection magnification cannot be strictly interpolated by the scale shift. This is because the modulation width can also be changed in addition to the shift of the center frequency of the reference position detection grating 19 projected on the light receiving element array due to the change of the projection magnification. When converted into a projected position on the light receiving element array, the width of the frequency component included in the detection area changes according to the square of inverse of the projection magnification. On the other hand, in this embodiment, L0=L1+L2 is satisfied, and accordingly the width of the spatial frequency of the reference position mark 22, which is converted into the projected position on the light receiving element array, does not change. In other words, a difference between both of the spatial frequencies converted into the projected position on the reference position mark 22 changes depending on a position on the light receiving element array, and the frequency of the moire fringe is non-uniform. Accordingly, the local maximum value of the distance signal R is decreased and also the width of the distance signal R spreads, and as a result the detection accuracy of the reference position is decreased.

In order to improve this, it is preferred that the frequency modulation is performed to be non-linear (for example, a quadratic function), i.e., the spatial frequency $f_{org}(x)$ of the reference position mark quadratically changes at a position in the moving direction. In this embodiment, a spatial frequency distribution of the reference position mark 22 is designed to be represented by expression (25) below.

$$f_{org}(x) = f_0 + \alpha x + \alpha_2 x^2 \tag{25}$$

In expression (25), symbol $\alpha_2$ is defined by expression (26) below.

$$\alpha_2 = m_2 \cdot f_0 \cdot \left( \frac{2}{W_{pd}} \cdot \frac{(L_0 + L_1 + L_2)}{L_0} \right)^2 \tag{26}$$

In expression (26), symbol $m_2$ denotes a secondary modulation degree of the spatial frequency component included in the detection range.

The non-uniformity of the moire fringe caused by the change of the projection magnification can be reduced by using $\alpha$ and $\alpha_2$ having an identical sign. Furthermore, the property that error detection is not easily performed at the position $\Delta x$ can be satisfied at the same time by performing the frequency modulation non-linearly. If the purpose is only to avoid the error detection at the position $\Delta x$, $\alpha$ and $\alpha_2$ may have different signs.

The spatial frequency distribution of the reference position detection grating 19 is designed correspondingly to the reference position mark 22 as represented by expression (27) below.

$$f_{index}(x) = f_1 + f_{shift} + \beta x + \beta_2 x^2 \tag{27}$$

In expression (27), symbol $\beta_2$ is defined by expression (28) below.

$$\beta_2 = m_2 \cdot f_1 \cdot \left( \frac{2}{W_{pd}} \cdot \frac{(L_0 + L_1 + L_2)}{(L_0 + L_1)} \right)^2 \tag{28}$$

Similarly, the spatial frequency modulation including a cubic function or a trigonometric function can also be designed.

Subsequently, the influence of the light amount distribution on the light receiving element array will be described. A width of the solitary wave of the reference position signal is around $1/(2 \times f0)$ (around $1/f0$ for the amplitude grating), and a minimum grating period where the interference fringe can be obtained is limited according to a size of the light emitting area of the light source 11. Therefore, when the size of the light emitting area of the light source 11 is large, a corresponding period of the reference position detection grating 19 is also rough. When the period of the reference position detection grating 19 is rough with respect to the width $X_{pd}$ of the light receiving element, the light amount that is incident on the respective light receiving element groups corresponding to the four phases of A+ phase, B+ phase, A− phase, and B− phase may be unbalanced. In this state, offsets occur in the two-phase signals S2(A) and S2(B), and the offset amounts greatly vary depending on the gap.

In order to reduce this influence, in the reference position detection grating 19 including the transmission parts and the light shielding parts with unequal intervals that are alternately arrayed in the position detection direction (X direction), the transmission parts include a light scattering structure in the position detection direction. As the light scattering structure, it is possible to apply a structure such as a fine concavo-convex structure and a fine light shielding film. Preferably, a fine grating structure including the light shielding film is used as the light scattering structure. More preferably, a grating period $d(x)$ is set as represented by expression (29) below.

$$d(x) = 2 f_{index}(x) \frac{\lambda L_2}{n} \cdot \frac{(L_0 + L_1)}{(L_0 + L_1 + L_2)} \tag{29}$$

When the grating period $d(x)$ represented by expression (29) is too rough with respect to the width of each transmission part, the grating period $d(x)$ may be set as represented by expression (30) below to mix different m areas.

$$d(x) = 2 f_{index}(x) \frac{\lambda L_2}{n} \cdot \frac{1}{2m+1} \cdot \frac{(L_0 + L_1)}{(L_0 + L_1 + L_2)} \tag{30}$$

($m$ is a positive integer)

Figure 8:
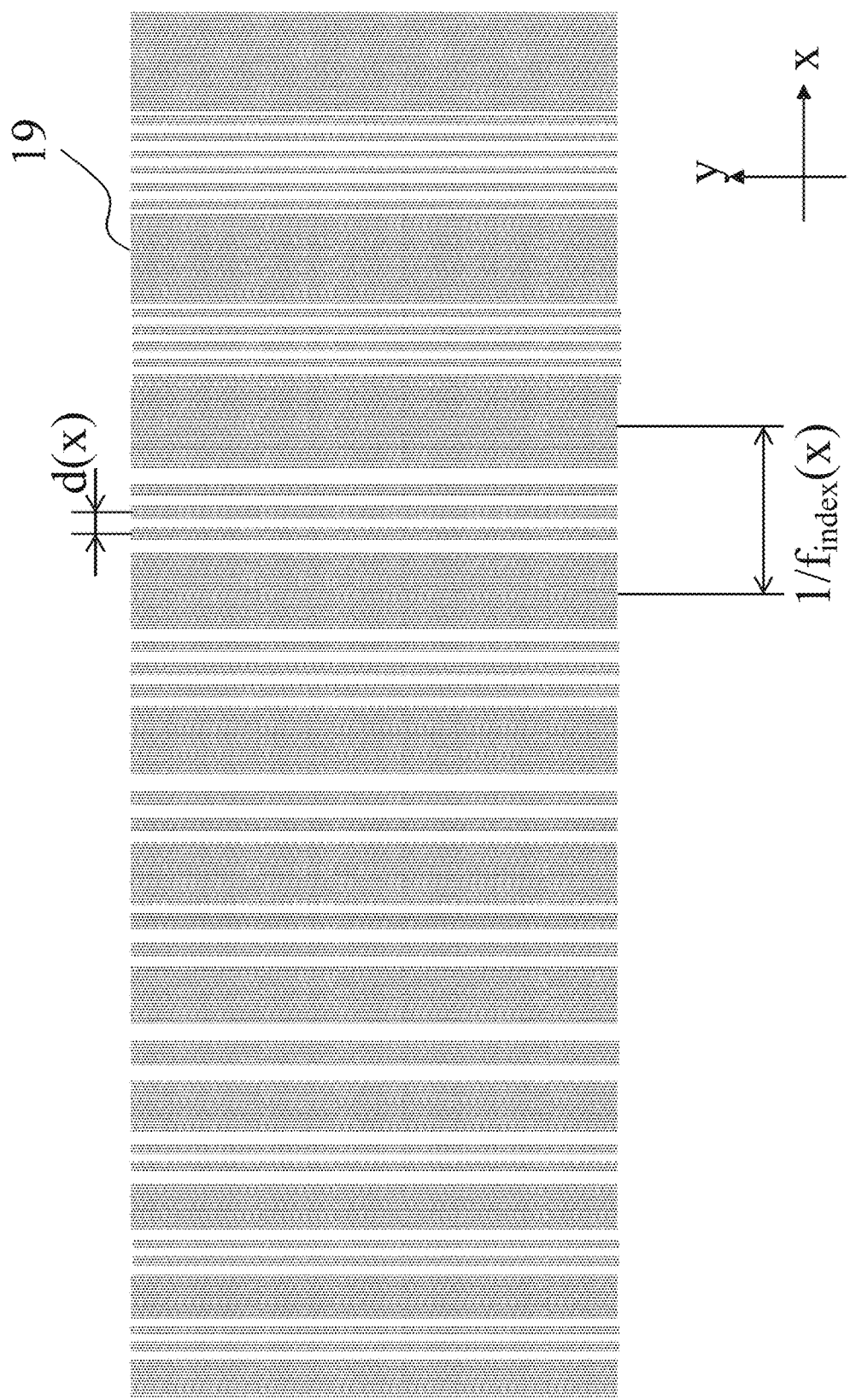
FIG. 8 is a diagram of illustrating an example where a fine grating structure is applied to a transmission part of a reference position detection grating in the first embodiment.
Figure 9A:
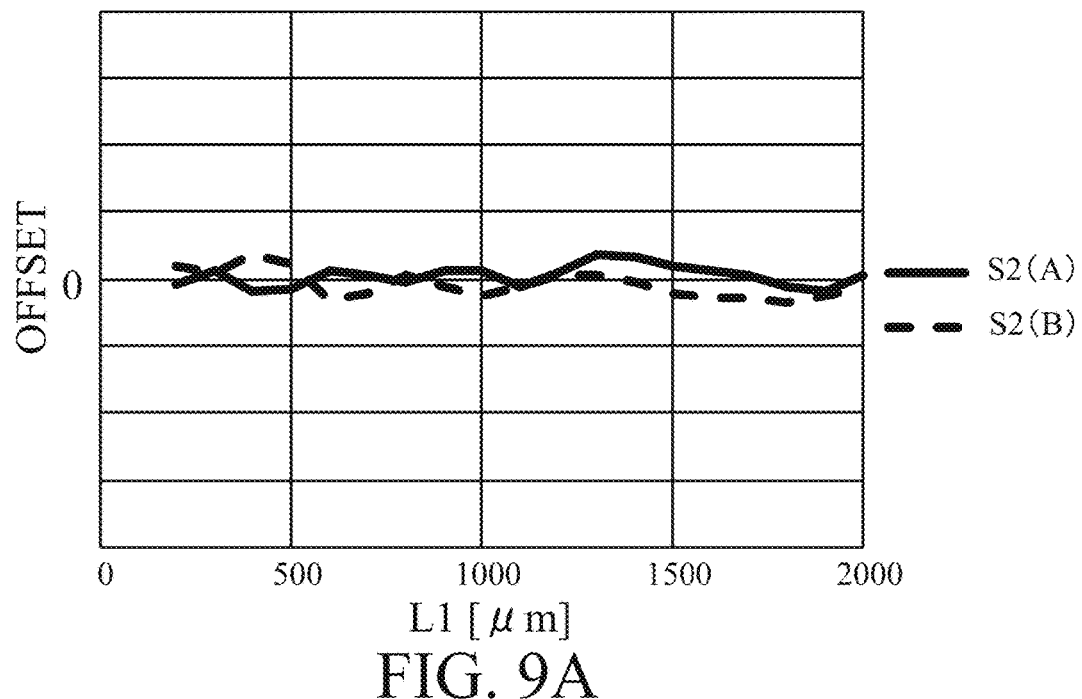
FIGS. 9A and 9B are diagrams of illustrating an offset variation with respect to the change of the distance in the first embodiment.
Figure 9B:
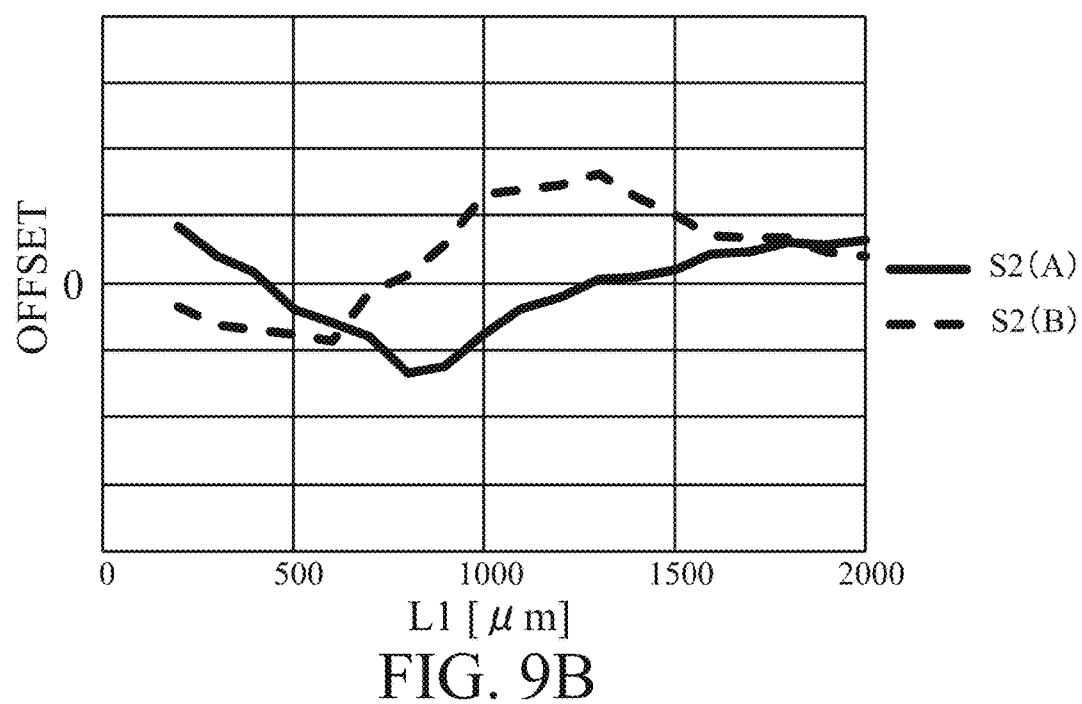

FIG. 8 is an example where the fine grating structure is applied to the transmission parts of the reference position detection grating 19. FIGS. 9A and 9B are diagrams of illustrating offset variations with respect to changes of a distance (gap). FIG. 9A illustrates the offset variation with respect to the change of the gap in a case where the fine grating structure represented by expression (29) is applied, and FIG. 9B illustrates the offset variation in a case where the fine grating structure is not applied. In each of FIGS. 9A and 9B, a horizontal axis indicates a distance L1 and a vertical axis indicates an offset.

In an area where $f_{index}(X)$ is large, the light scattering structure does not have to be applied since the period of the reference position detection grating 19 is sufficiently fine with respect to the width $X_{pd}$ of the light receiving element. In order to give priority to making an average light amount to be uniform with respect to the light scattering structure, in addition to improvement of a signal efficiency, it is effective to decrease an aperture ratio (i.e., a ratio that is obtained by dividing the width of the transmission part by the grating period).

Preferably, the light scattering structure has a spatial frequency higher than a section frequency (first spatial frequency) of the reference position mark 22. By applying the scattering structure in the position detection direction to the transmission parts of the reference position detection grating 19, the light amount intensity on the light receiving element surface is smoothed. As a result, the stability of the signal or the offset can be improved.

Next, a method of obtaining a satisfactory contrast on the surface of the reference position detection grating 19 by using the reference position mark 22 having a wide spatial frequency width will be described. When the reference position mark 22 has a grating period not more than around 10 μm, due to an averaging effect by the wavelength width of the light source 11 and an averaging effect by a difference of optical path lengths in the light receiving area, a stable contrast with small gap dependence can be obtained. However, when the reference position mark 22 having a grating period not less than 10 μm is used, due to interference of higher-order diffracted light, a range of a propagation length L where the satisfactory contrast can be obtained is limited. The propagation length L is represented by expression (31) below.

$$L = \frac{2 \cdot L_0 \cdot L_1}{L_0 + L_1} \quad (31)$$

When the grating structure is identical, the contrast periodically varies depending on the propagation length that is normalized by a relation $S_p^2/\lambda$ between a light source wavelength $\lambda$ and a signal period $S_p$. Accordingly, with respect to a common propagation length, it is not possible to obtain the satisfactory contrast for a whole of the mark including an area where the signal period $S_p$ greatly varies. This problem can be improved by adopting an area where the grating structure changes depending on the local signal period $S_p(x)$.

For example, the local signal period $S_p(x)$ is represented by expression (32) below by using $f_{org}(x)$ represented by expression (25).

$$S_p(x) = \frac{1}{2 \cdot f_{org}(x)} \quad (32)$$

Figure 10:
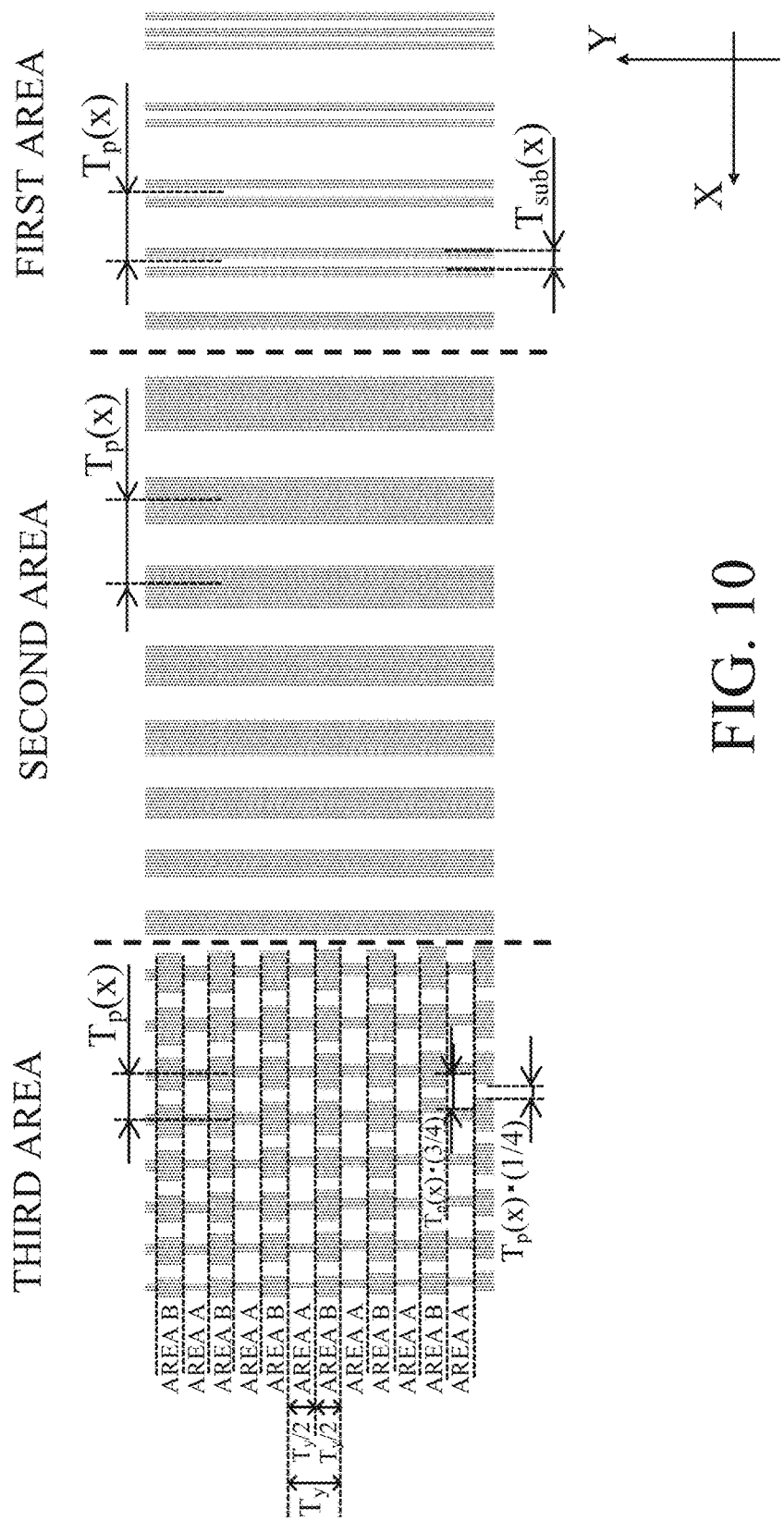
FIG. 10 is a diagram of illustrating the reference position mark as a modification in the first embodiment.

FIG. 10 is a diagram of the reference position mark 22 that is provided with areas where a grating structure changes depending on the local signal period $S_p(x)$ as a modification of this embodiment. In FIG. 10, gray portions indicate concave portions of the stepped pattern. The reference position mark 22 in this configuration includes three areas (first area, second area, and third area) whose grating structures are different from each other depending on the position in the moving direction (X direction).

The first area is an area which satisfies conditional expression (33) below.

$$S_p(x) > \frac{\sqrt{\lambda} \cdot L}{0.5} \quad (33)$$

The second area is an area which satisfies conditional expression (34) below.

$$\frac{\sqrt{\lambda} \cdot L}{1.5} < S_p(x) < \frac{\sqrt{\lambda} \cdot L}{0.5} \quad (34)$$

The third area is an area which satisfies conditional expression (35) below.

$$S_p(x) < \frac{\sqrt{\lambda} \cdot L}{1.5} \quad (35)$$

When there is an area where $S_p(x) > \sqrt{\lambda} \cdot L/2.5$ is satisfied, the structure of the second area may be repeated.

The first area has a local grating period $T_p(x)$ that satisfies $T_p(x)=S_p(x)=1/(2 \cdot f_{org}(x))$, and it has a structure including at least one fine sub-grating in each grating. It is preferred that a period $T_{sup}(x)$ of the sub-gratings is set to a period that is represented by expression (36) below or a period close to it where $L_c$ is a designed center propagation length.

$$T_{sub}(x) = \frac{\lambda \cdot L_c}{T_p(x)} \quad (36)$$

Figure 11:
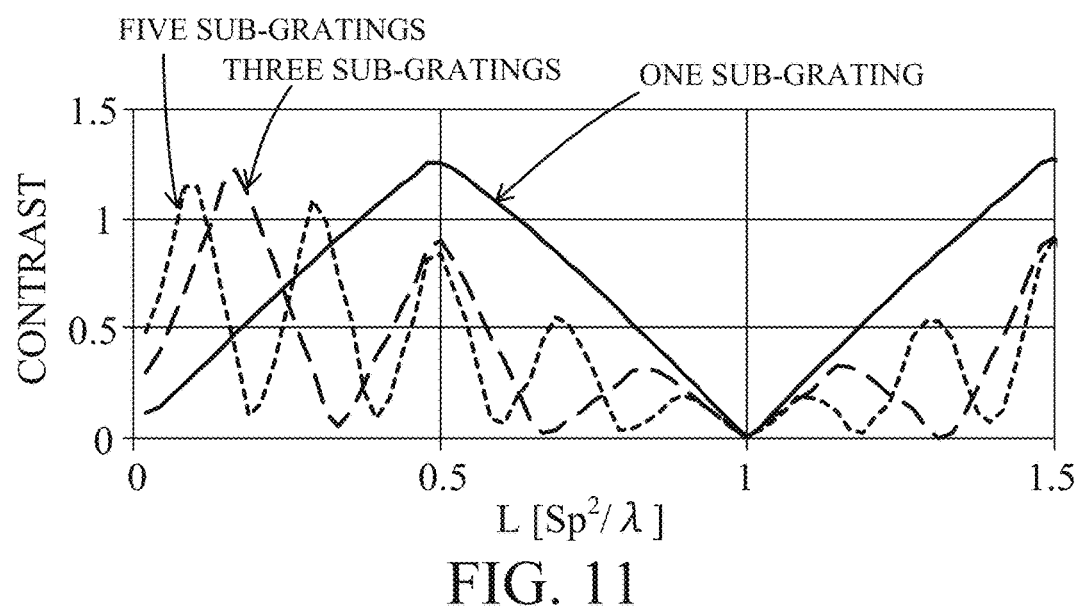
FIG. 11 is a graph of contrast of a diffracted interference image with respect to a propagation length of a structure having a sub-grating in the first embodiment.

When the number of the sub-grating is one, a width of the sub-grating is set to $T_{sub}(x)/2$. FIG. 11 is a graph of a diffracted interference image contrast ($T_p$ periodic modulation amplification/DC component) with respect to the propagation length L of the structure including the sub-gratings (i.e., one, three, or five sub-gratings). In FIG. 11, a horizontal axis indicates the propagation length L, and a vertical axis indicates the contrast.

As illustrated in FIG. 11, a peak of the contrast is shifted to a closer side with increasing the number of the sub-gratings. Accordingly, a contrast of an effective grating interference image can be improved on condition that $L<0.5 \cdot S_p^2/\lambda$ is satisfied. Compared with the condition of expression (33), this indicates that a satisfactory contrast can be obtained in the first area.

Figure 12:
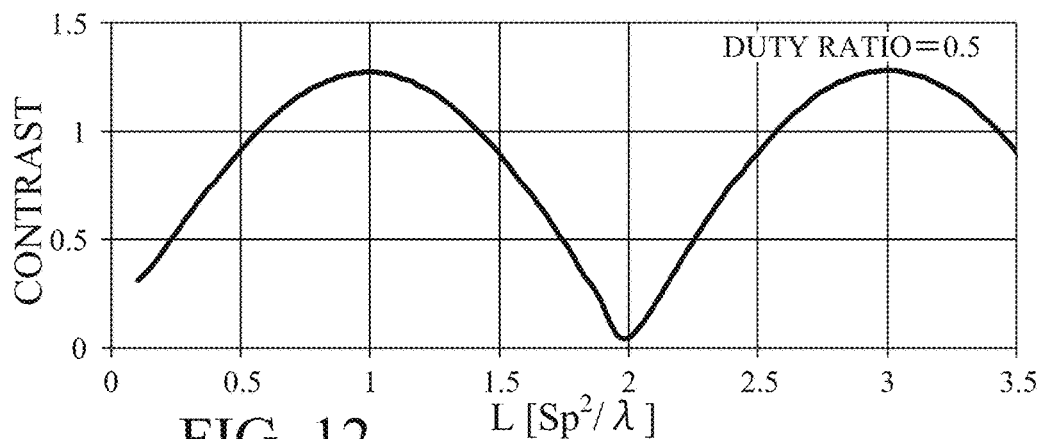
FIG. 12 is a graph of the contrast of the diffracted interference image with respect to the propagation length when a grating duty ratio is 0.5 in the first embodiment.

The second area has the local grating period $T_p(x)$ that satisfies $T_p(x)=2 \cdot S_p(x)=1/f_{org}(x)$ and has a grating duty ratio DR of 0.5 as a rate of a width of concave parts of the stepped pattern with respect to the grating period $T_p(x)$. FIG. 12 is a graph of the diffracted interference image contrast (($T_p/2$ periodic modulation amplification)/DC component) with respect to the propagation length L when the grating duty ratio DR is 0.5. As illustrated in FIG. 12, the contrast of the effective grating interference image can be improved in a range of $0.5 \cdot S_p^2/\lambda < L < 1.5 \cdot S_p^2/\lambda$, particularly around $L=S_p^2/\lambda$. Compared with the condition of expression (34), this indicates that a satisfactory contrast can be obtained in the second area.

The third area has the local grating period $T_p(x)$ that satisfies $T_p(x)=2 \cdot S_p(x)=1/f_{org}(x)$, and further it is divided into areas in a direction (Y direction) perpendicular to the moving direction and provided with areas A and B alternately. A width of each of the areas A and B in the Y direction is 25 μm, and an arrangement period $T_y$ in the Y direction is 50 μm. The grating duty ratio DR as a rate of a width of concave parts of the stepped pattern with respect to the grating period $T_p(x)$ is set to 0.25 for the area A and 0.75 for the area B.

Figure 13:
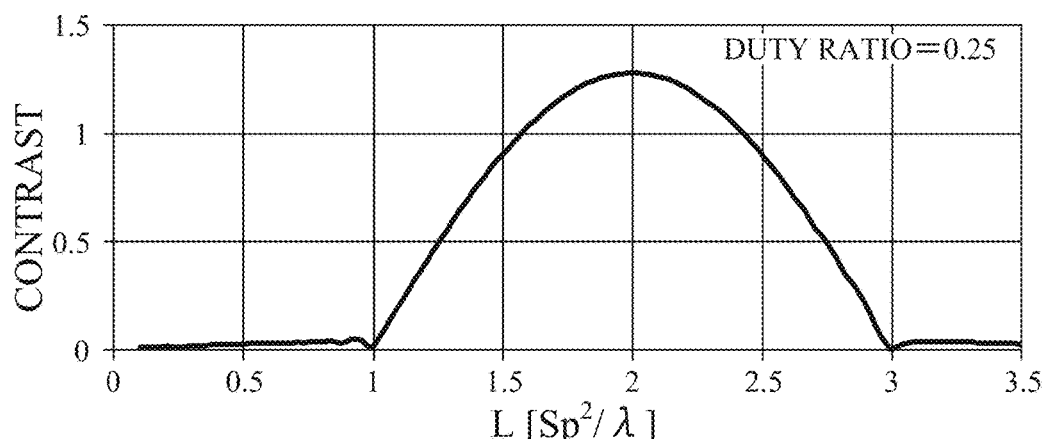
FIG. 13 is a graph of the contrast of the diffracted interference image with respect to the propagation length when a grating duty ratio is 0.25 in the first embodiment.
Figure 14:
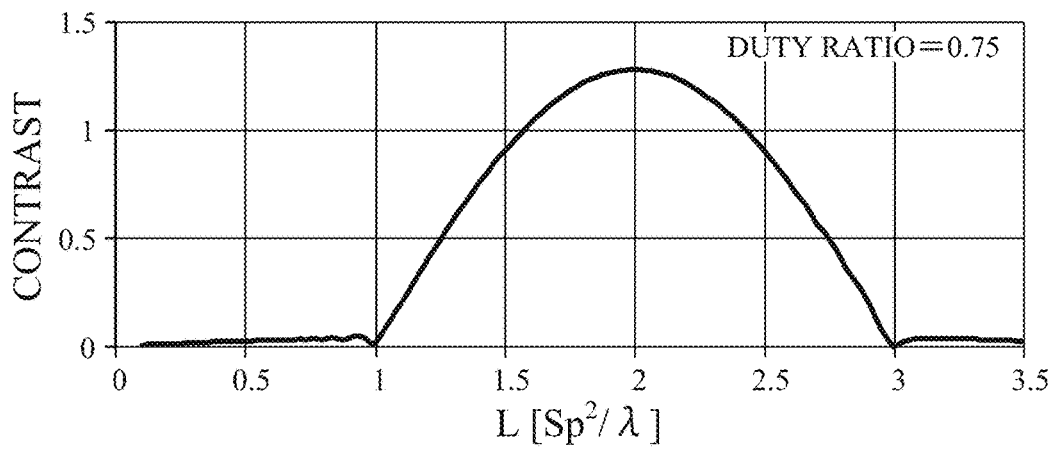
FIG. 14 is a graph of the contrast of the diffracted interference image with respect to the propagation length when a grating duty ratio is 0.75 in the first embodiment.

FIG. 13 is a graph of the diffracted interference image contrast ($(T_p/2$ periodic modulation amplification)/DC component) with respect to the propagation length L when the grating duty ratio DR is 0.25. Similarly, FIG. 14 is a graph of the diffracted interference image contrast when the grating duty ratio DR is 0.75. When the grating duty ratio DR is set to 0.25 or 0.75, as illustrated in FIGS. 13 and 14, the contrast of the effective grating interference image can be improved in a range of $1.5 \cdot Sp^2/\lambda < L < 2.5 \cdot Sp^2/\lambda$, particularly around $L=2 \cdot Sp^2/\lambda$. Compared with the condition of expression (34), this indicates that a satisfactory contrast can be obtained in the third area. With respect to the grating duty ratios DR of 0.25 and 0.75, double periodic components generated by interference images of 0th order light and ±1st order diffracted light corresponding to k=1 have reversed phases. Accordingly, when both of them are included in the same area size in the detection area, unnecessary components can be removed. As a result, a satisfactory contrast can be obtained with respect to the reference position mark 22 having a wider spatial frequency range.

By using the moire fringe as described above, it is possible to acquire a stable reference position signal by using the light receiving element array. Accordingly, detection of the reference position signal can be achieved with high accuracy by using a small-size apparatus.

Second Embodiment

Figure 15:
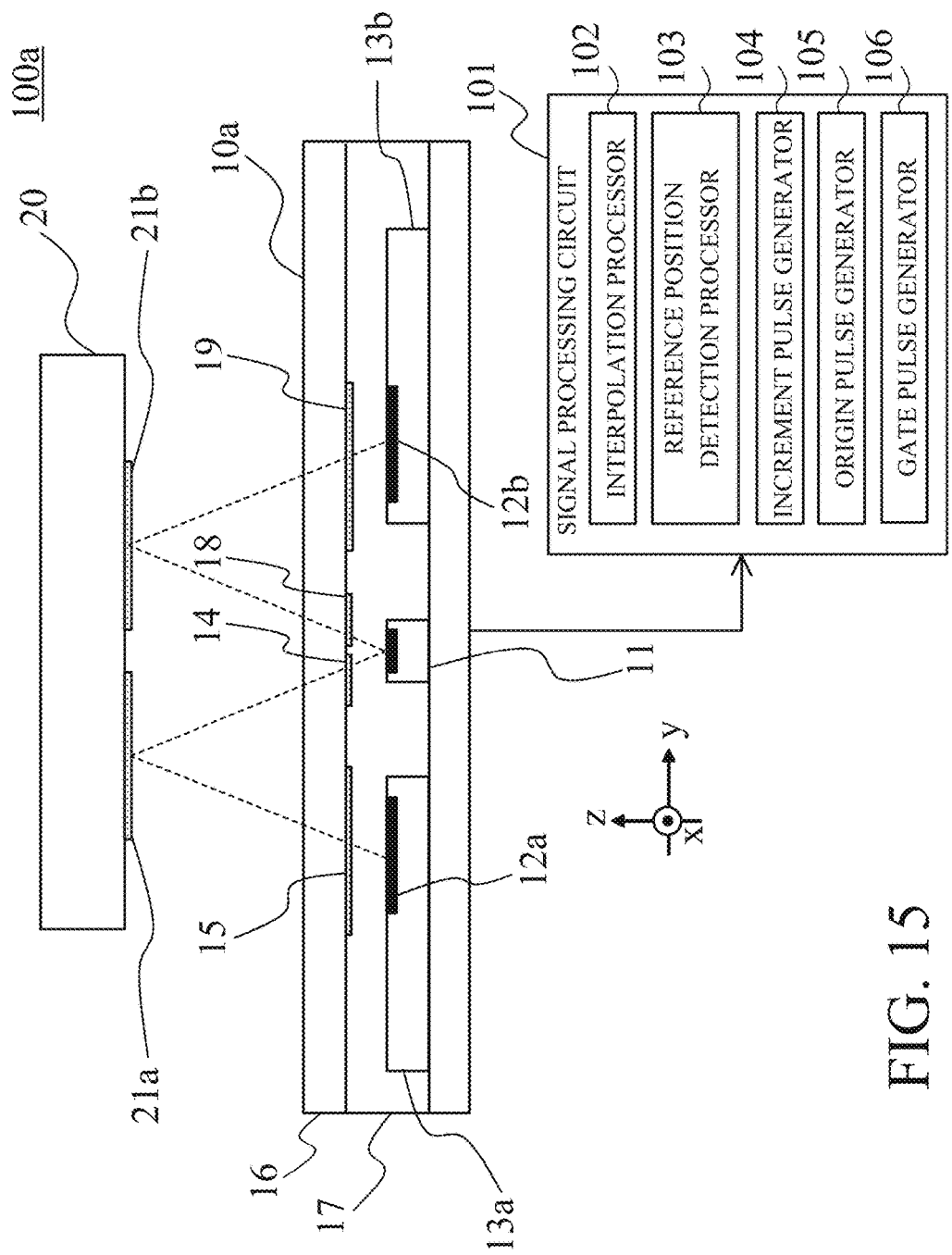
FIG. 15 is a configuration diagram of a position detection apparatus in a second embodiment.

Next, referring to FIG. 15, an optical position detection apparatus in a second embodiment of the present invention will be described. FIG. 15 is a configuration diagram of a position detection apparatus 100a in this embodiment. The position detection apparatus 100a is different from the position detection apparatus 100 of the first embodiment in that the position detection apparatus 100a includes a sensor unit 10a that is provided with a reference position light source grating 18. Other configurations of the position detection apparatus 100a are the same as those of the position detection apparatus 100 in the first embodiment, and accordingly descriptions thereof are omitted.

The reference position light source grating 18 is provided in an optical path from the light source (light emitting element) toward the scale track 21b. The reference position light source grating 18 is a transmission type diffraction grating including transmission parts and light shielding parts that are alternately arrayed in the position detection direction (X direction). In the sensor unit 10a, each of the light source grating 14, the increment detection grating 15, the reference position light source grating 18, and the reference position detection grating 19 is provided by forming a chromium film as transmission parts on a surface of the cover glass 16. The cover glass 16 is stuck to the light translucent resin 17 that seals the light source 11 and the light receiving ICs 13a and 13b, and it is optically integrated with the light source 11 and the light receiving ICs 13a and 13b.

Figure 16:
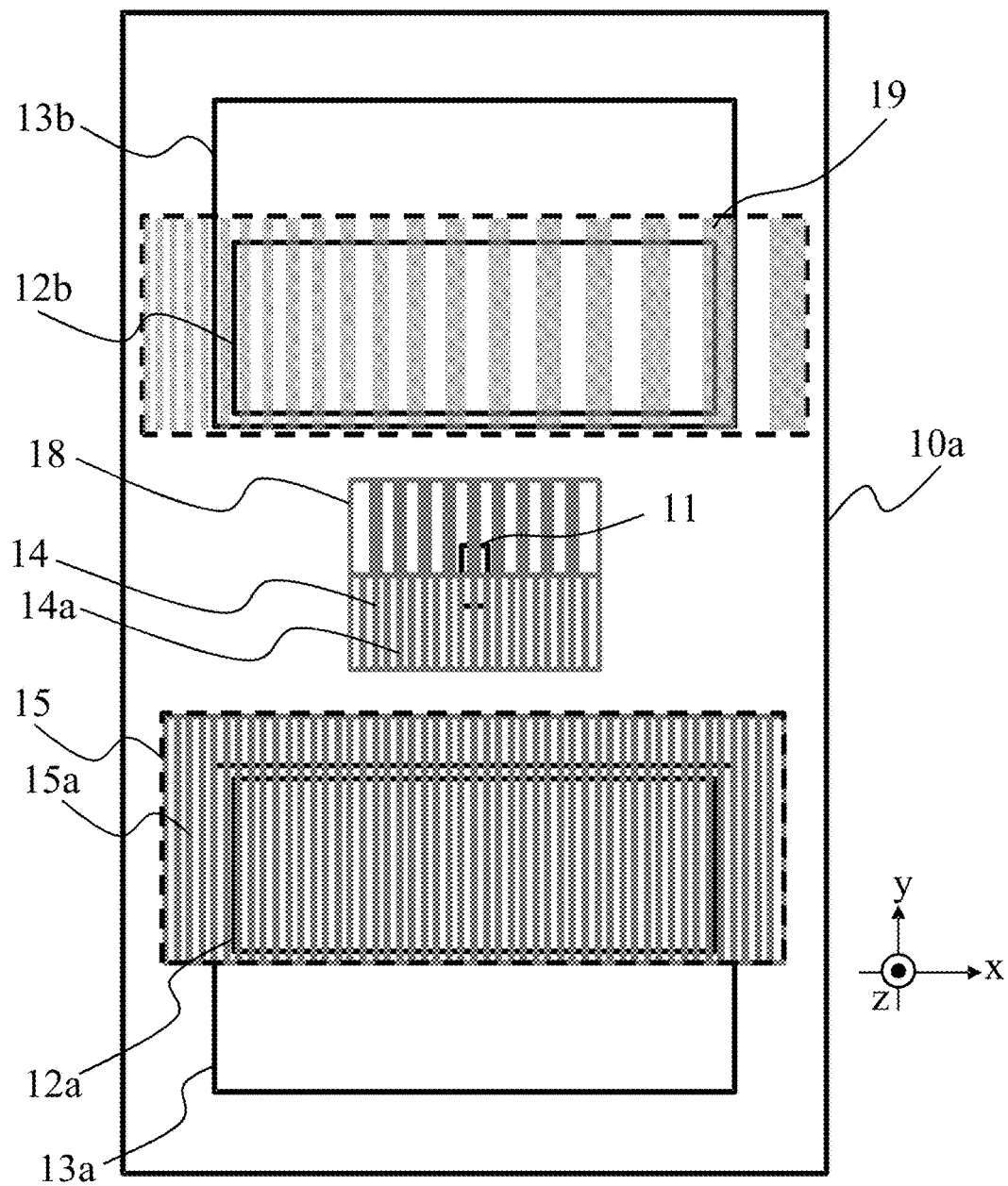
FIG. 16 is a plan view of a sensor unit in the second embodiment.

Next, referring to FIG. 16, the configuration of the sensor unit 10a will be described. FIG. 16 is a plan view of the sensor unit 10a, and it illustrates a view of the sensor unit 10a from the scale 20. The sensor unit 10a is provided with the reference position light source grating 18 in addition to each element of the sensor unit 10 of the first embodiment. A pitch (pattern period) of a grating pattern 18a of the reference position light source grating 18 is 40 μm.

Figure 17:
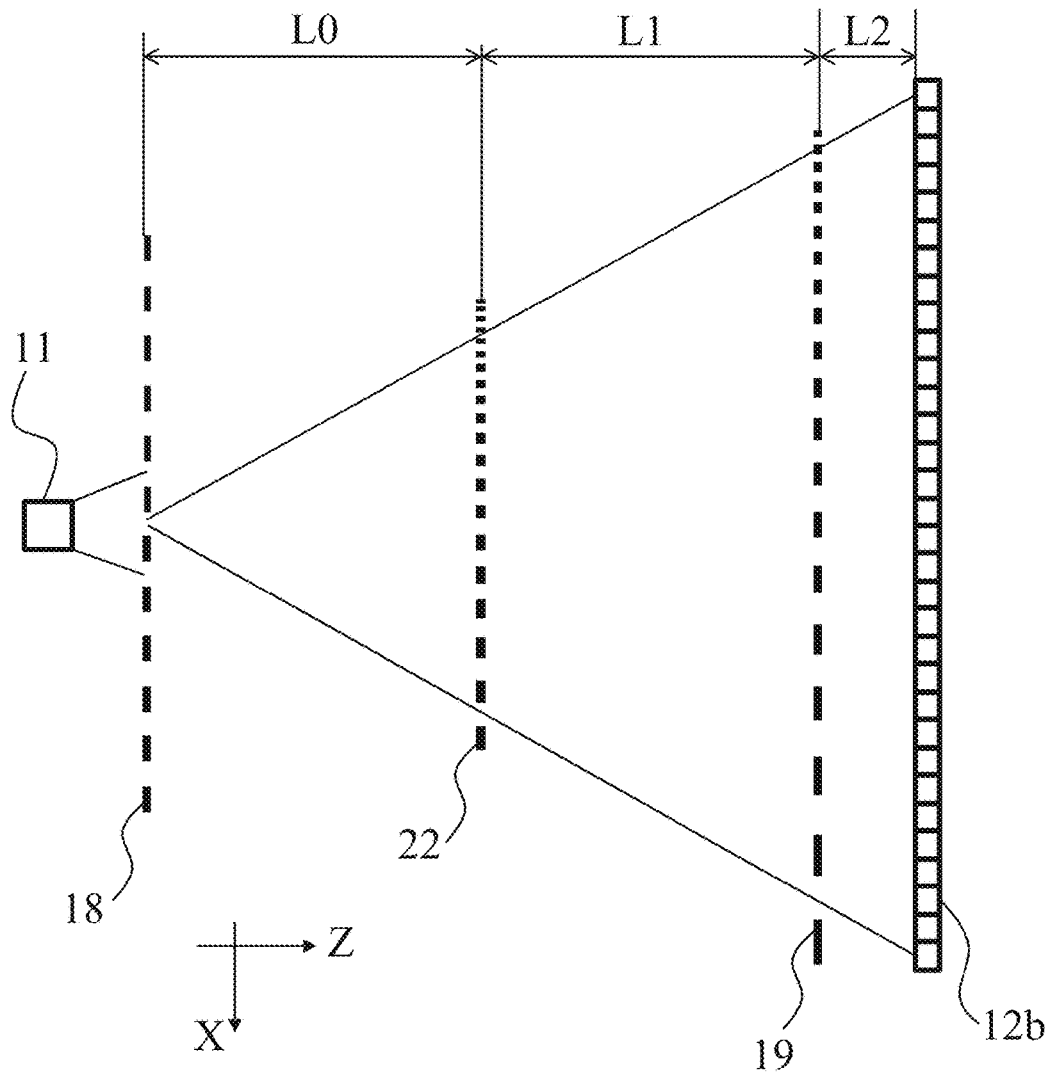
FIG. 17 is a development view of an optical path in the second embodiment.

Next, referring to FIG. 17, an optical path in the position detection apparatus 100a will be described. FIG. 17 is a development view of the optical path in the position detection apparatus 100a, and it illustrates the optical path developed to treat reflection as transmission. In this embodiment, the light source 11 and the reference position light source grating 18 constitute a secondary light source array. A distance L0 as an effective optical path length from the reference position light source grating 18 to the reference position mark 22 is set within a range of 1 mm±0.3 mm. The effective optical path length is a value (or its approximation value) obtained by dividing a physical length by a refractive index. A distance L1 as an effective optical path length from the reference position mark 22 to the reference position detection grating 19 is set to L0 mm (L1=L0 mm). A distance L2 as an effective optical path length from the reference position detection grating 19 to the light receiving element array 12b is 0.2 mm.

In this embodiment, a spatial frequency distribution of the reference position mark 22 is represented by expression (25), f0 in expression (25) is 25 [mm$^{-1}$], m in expression (2) is 0.7, and m$_2$ in expression (26) is 0.14. A size of a light emitting area in the detection direction of the light source 11 is 0.04 mm.

Figure 18A:
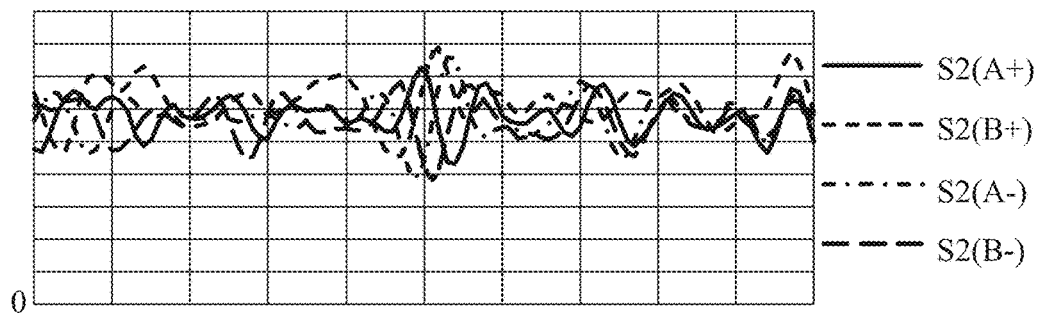
FIGS. 18A to 18E are signal waveform diagrams in the vicinity of a reference position mark in the second embodiment.
Figure 18B:
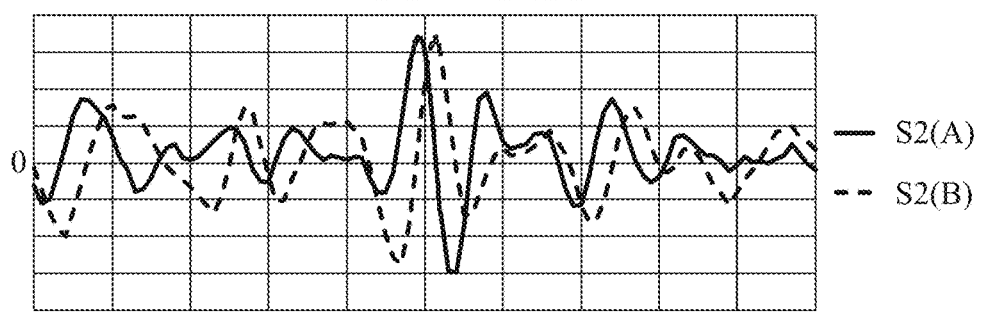
Figure 18C:
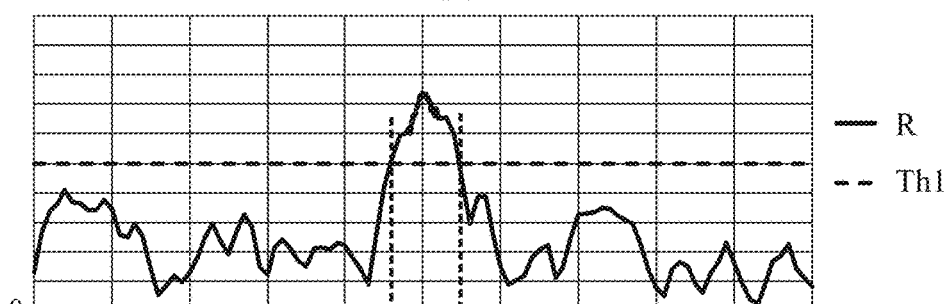
Figure 18D:
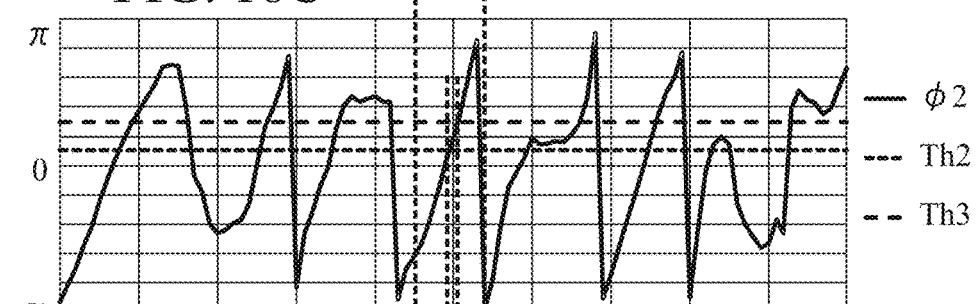
Figure 18E:
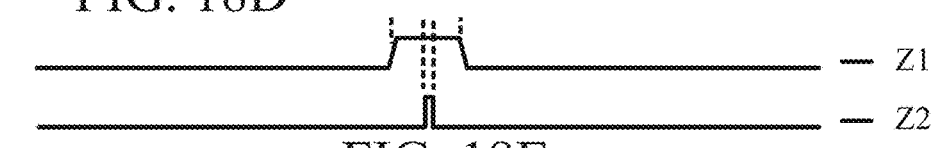

Next, referring to FIGS. 18A to 18E, each signal waveform in the vicinity of the reference position mark 22 will be described. FIGS. 18A to 18E are signal waveform diagrams in the vicinity of the reference position mark 22. FIG. 18A illustrates waveforms of four-phase signals S2(A+), S2(B+), S2(A−), and S2(B−) in the vicinity of the reference position mark 22. FIG. 18B illustrates waveforms of two-phase signals S2(A) and S2(B) in the vicinity of the reference position mark 22. FIG. 18C illustrates waveforms of a distance signal R and a threshold value Th1 in the vicinity of the reference position mark 22. FIG. 18D illustrates waveforms of a phase signal Φ2 and threshold values Th2 and Th3 in the vicinity of the reference position mark 22. FIG. 18E illustrates waveforms of a gate pulse Z1 and an origin signal Z2 (origin pulse) in the vicinity of the reference position mark 22.

In this embodiment, the reference position light source grating 18 is added so that a spatial periodic image that is much smaller than the size of the light emitting area of the light source 11 can be detected. As a result, it is possible to improve a reference position accuracy.

Hereinafter, a case where the relation between a pitch period P$_3$ (grating period) of the reference position light source grating 18 and a local spatial frequency f$_{index}$(X) of the reference position mark 22 is shifted from expression (37) below will be considered. In this case, according to the shift amount, a contrast of an interference fringe that is formed on the reference position detection grating 19 is lowered and a spatial frequency shift occurs.

$$\frac{P_3 \cdot L_1}{L_0} = \frac{(L_0 + L_1)}{k \cdot f_{index}(x) \cdot L_1} \tag{37}$$

This influence depends on the size of the light emitting area of the light source 11, the distance between the reference position light source grating 18 and the light source 11, and the like. Preferably, in accordance with the spatial frequency shift of the interference fringe, the spatial frequency distribution of the reference position detection grating 19 is corrected by using a correction coefficient γ as represented by expression (38) below.

$$f_{index}(x) = f_1 + f_{shift} + \gamma \cdot (\beta x + \beta_2 x^2) \tag{38}$$

Similarly to the reference position mark 22, the reference position light source grating 18 may be provided as a grating with unequal intervals. In this case, a signal amplitude can be maximized, but it is sensitive to a position relation to the light source 11.

In the configuration described above, it is possible to narrow the pulse without being limited by the size of the light source. As a result, a highly-accurate reference position signal can be achieved.

Third Embodiment

Figure 19:
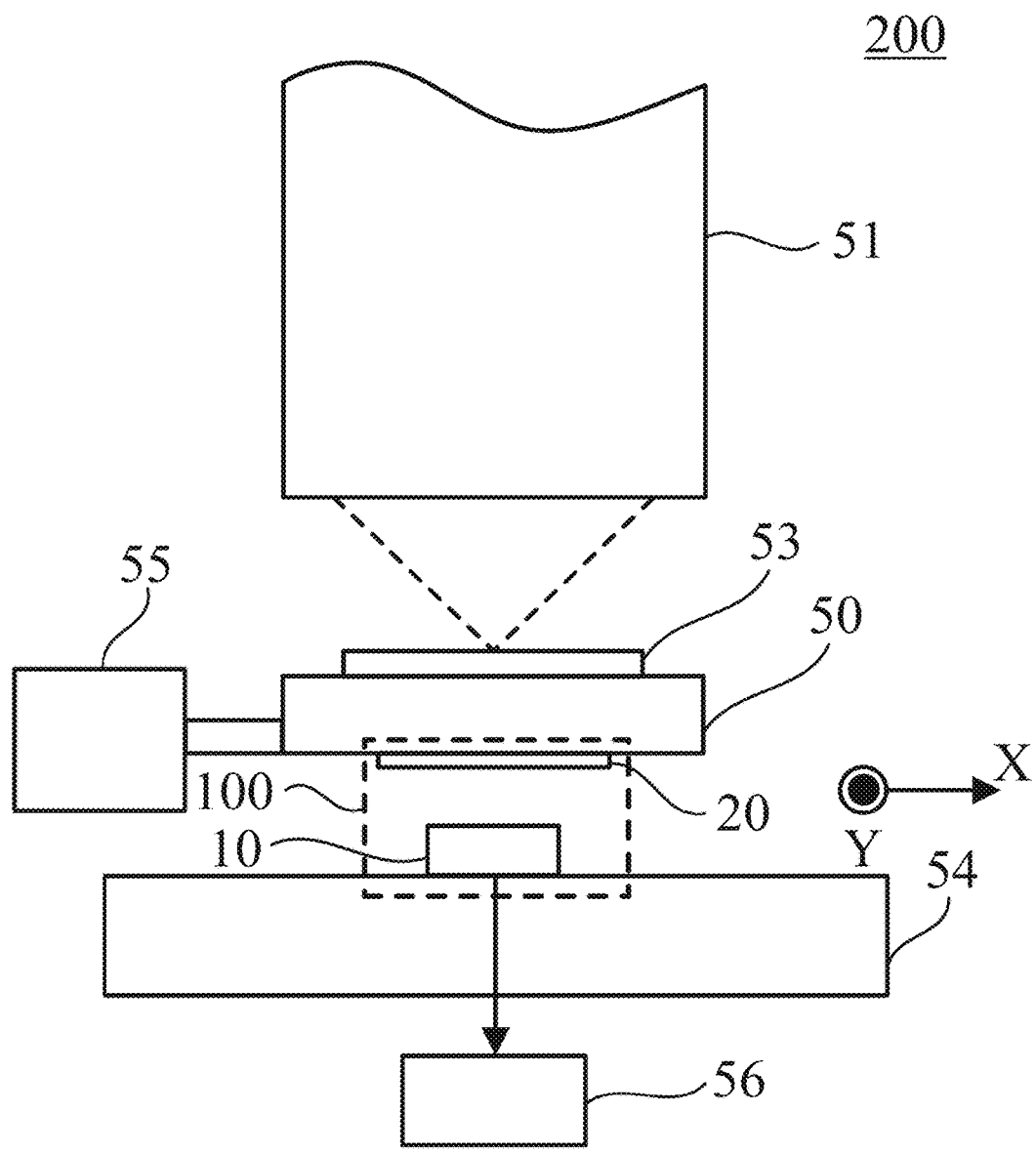
FIG. 19 is a configuration diagram of an exposure apparatus in a third embodiment.

Next, referring to FIG. 19, an exposure apparatus in a third embodiment of the present invention will be described. FIG. 19 is a configuration diagram of an exposure apparatus 200 in this embodiment. The exposure apparatus 200 is configured to expose an electronic circuit on a semiconductor wafer, and it includes for example the position detection apparatus 100 described in the first embodiment. The exposure apparatus 200 detects a position of a stage that mounts the semiconductor wafer and that can be driven (i.e., that is movable) in a two-dimensional direction by using the position detection apparatus 100.

In FIG. 19, reference numeral 50 denotes a stage as a movable portion that is operable, and a wafer 53 (semiconductor wafer) is mounted on the stage 50. Reference numeral 51 denotes a projection optical system that projects (exposes) an electronic circuit image as an optical image of a mask (not illustrated) on the wafer 53. The stage 50 is driven by a drive mechanism 55 in an X direction and a Y direction relative to the projection optical system 51. Thus, a projection position of the electronic circuit image on the wafer 53 is controlled.

Reference numeral 20 denotes a scale of the position detection apparatus 100, and reference numeral denotes a sensor unit of the position detection apparatus 100. The scale 20 is attached to the stage (movable portion). The sensor unit 10 is attached to a body 54 as a fixed portion of the exposure apparatus 200. In this embodiment, the relation between the fixed portion and the movable portion may be reversed to each other, and thus the sensor unit 10 can be attached to the movable portion and the scale 20 can be attached to the fixed portion. In other words, the sensor unit 10 and the scale 20 only have to be relatively movable. In this embodiment, instead of the position detection apparatus 100 (sensor unit 10), the position detection apparatus 100*a* (sensor unit 10*a*) of the second embodiment may be used.

Reference numeral 56 denotes a controller that calculates a position of the stage 50 based on output signals from the light receiving element arrays 12*a* and 12*b* of the sensor unit 10 to control the drive mechanism 55.

As described above, the position of the stage 50 of the exposure apparatus 200 can be stably detected with high resolution by using the position detection apparatus 100 (or the position detection apparatus 100*a*), and thus it can control a movement (operation) of the stage 50 with high accuracy.

The position detection apparatus in each embodiment can be applied also to various apparatuses other than the exposure apparatus. For example, a machine tool apparatus that includes a machine tool including at least one of a robot arm and a conveyer which conveys an object to be assembled, and the encoder (position detection apparatus) in each embodiment which detects at least one of a position and an attitude of the machine tool is provided, and accordingly the position of the machine tool (robot arm or conveyer) can be detected with high accuracy.

While this embodiment describes the reflection type position detection apparatus where light from the light source is reflected by the reflection type scale (scale grating) to be received by the light receiving element array, it is not limited thereto. Each embodiment can be applied also to for example a transmission type position detection apparatus where light from the light source transmits through a transmission type scale to be received by the light receiving element array. While this embodiment describes the position detection apparatus (linear encoder) using the linear scale, it is not limited thereto. Each embodiment can be applied also to for example a rotary encoder using a rotary scale.

According to each embodiment, small-size position detection apparatus, machine tool apparatus, and exposure apparatus that are capable of detecting a reference position with high accuracy at low cost can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-049750, filed on Mar. 14, 2016, which is hereby incorporated by reference herein in its entirety.

What is claimed is:

1. A position detection apparatus comprising:
a scale including a reference position grating configured to change a pattern period along a first direction;
a detector including a light source configured to emit a divergent light beam, a detection grating configured to change a pattern period in the first direction, and a light receiver including a plurality of light receiving elements arrayed along the first direction; and
a signal processor configured to process a signal output from the detector, wherein:
the scale and the detector are relatively movable in the first direction,
the signal processor acquires a relative reference position between the scale and the detector by using a light intensity distribution of the divergent light beam obtained via the reference position grating and the detection grating,
the detection grating has a first spatial frequency that is offset by a predetermined frequency offset amount with respect to a local spatial frequency of an interference image from the reference position grating,
the detection grating is provided in an optical path between the scale and the light receiver, and
the light receiver detects a component of a second spatial frequency that is lower than the first spatial frequency in the light intensity distribution transmitting through the detection grating.

2. The position detection apparatus according to claim 1, wherein the light receiver includes a plurality of light receiving element groups that are cyclically arrayed to detect a plurality of phase components of the second spatial frequency.

3. The position detection apparatus according to claim 1, wherein the predetermined frequency offset amount is constant in the detection grating.

4. The position detection apparatus according to claim 1, wherein a spatial frequency of the reference position grating linearly changes in the first direction.

5. The position detection apparatus according to claim 1, wherein a spatial frequency of the reference position grating nonlinearly changes in the first direction.

6. The position detection apparatus according to claim 5, wherein the spatial frequency of the reference position grating quadratically changes in the first direction.

7. The position detection apparatus according to claim 1,
wherein the detection grating includes transmission parts and light shielding parts with unequal intervals that are alternately arrayed along the first direction, and
wherein the transmission parts of the detection grating include a light scattering structure in the first direction.

8. The position detection apparatus according to claim 7, wherein the light scattering structure includes a spatial frequency that is higher than the first spatial frequency.

9. The position detection apparatus according to claim 1, wherein the signal processor is configured to:
calculate a first phase signal and a second phase signal that have different phases by 90 degrees from each other based on the signal output from the detector, and
calculate, as a first evaluation value, a square root of a sum of a square of the first phase signal and a square of the second phase signal to compare the first evaluation value with a predetermined threshold value to acquire the reference position.

10. The position detection apparatus according to claim 1, wherein the signal processor is configured to:
calculate a first phase signal and a second phase signal that have different phases by 90 degrees from each other based on the signal output from the detector,
calculate, as a first evaluation value, a square root of a sum of a square of the first phase signal and a square of the second phase signal,
calculate, as a second evaluation value, a phase angle obtained by an arctangent operation of the first phase signal and the second phase signal, and
acquire the reference position based on the first evaluation value and the second evaluation value.

11. A machine tool apparatus comprising:
a machine tool including at least one of a robot arm and a conveyer configured to convey an object to be assembled, and
a position detection apparatus configured to detect at least one of a position and an attitude of the machine tool,
wherein the position detection apparatus comprises:
a scale including a reference position grating configured to change a pattern period along a first direction;
a detector including a light source configured to emit a divergent light beam, a detection grating configured to change a pattern period in the first direction, and a light receiver including a plurality of light receiving elements arrayed along the first direction; and
a signal processor configured to process a signal output from the detector, wherein:
the scale and the detector are relatively movable in the first direction,
the signal processor acquires a relative reference position between the scale and the detector by using a light intensity distribution of the divergent light beam obtained via the reference position grating and the detection grating,
the detection grating has a first spatial frequency that is offset by a predetermined frequency offset amount with respect to a local spatial frequency of an interference image from the reference position grating,
the detection grating is provided in an optical path between the scale and the light receiver, and
the light receiver detects a component of a second spatial frequency that is lower than the first spatial frequency in the light intensity distribution transmitting through the detection grating.

12. An exposure apparatus comprising:
a stage configured to mount a semiconductor wafer to be movable in a two-dimensional direction; and
a position detection apparatus configured to detect a position of the stage,
wherein the position detection apparatus comprises:
a scale including a reference position grating configured to change a pattern period along a first direction;
a detector including a light source configured to emit a divergent light beam, a detection grating configured to change a pattern period in the first direction, and a light receiver including a plurality of light receiving elements arrayed along the first direction; and
a signal processor configured to process a signal output from the detector, wherein:
the scale and the detector are relatively movable in the first direction,
the signal processor acquires a relative reference position between the scale and the detector by using a light intensity distribution of the divergent light beam obtained via the reference position grating and the detection grating,
the detection grating has a first spatial frequency that is offset by a predetermined frequency offset amount with respect to a local spatial frequency of an interference image from the reference position grating,
the detection grating is provided in an optical path between the scale and the light receiver, and
the light receiver detects a component of a second spatial frequency that is lower than the first spatial frequency in the light intensity distribution transmitting through the detection grating.

* * * * *